(12) United States Patent
Yang

(10) Patent No.: US 12,396,325 B2
(45) Date of Patent: Aug. 19, 2025

(54) DISPLAY DEVICE AND ELECTRONIC DEVICE HAVING DISPLAY LAYER, SECOND DRIVING LAYER, AND FIRST DRIVING LAYER STACKED IN SEQUENCE

(71) Applicant: GUANGDONG OPPO MOBILE TELECOMMUNICATIONS CORP., LTD., Dongguan (CN)

(72) Inventor: Xin Yang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 632 days.

(21) Appl. No.: 17/687,964

(22) Filed: Mar. 7, 2022

(65) Prior Publication Data
US 2022/0190083 A1     Jun. 16, 2022

Related U.S. Application Data

(63) Continuation of application No. PCT/CN2020/118940, filed on Sep. 29, 2020.

(30) Foreign Application Priority Data

Oct. 31, 2019   (CN) .......................... 201911050809.4
Oct. 31, 2019   (CN) .......................... 201921868153.2

(51) Int. Cl.
*H10K 59/121*     (2023.01)
*H10K 59/131*     (2023.01)
(Continued)

(52) U.S. Cl.
CPC ....... *H10K 59/1213* (2023.02); *H10K 59/131* (2023.02); *H10K 59/65* (2023.02);
(Continued)

(58) Field of Classification Search
CPC .... H10K 59/17; H10K 59/65; H10K 59/1213; H10K 59/123; H10K 59/131;
(Continued)

(56) References Cited

U.S. PATENT DOCUMENTS

2012/0206669 A1* 8/2012 Kim .................. G02F 1/133308
                                                        349/153
2016/0181339 A1* 6/2016 Lee ..................... H01L 27/1248
                                                        257/40
(Continued)

FOREIGN PATENT DOCUMENTS

CN      107610635 A      1/2018
CN      108389879 A      8/2018
(Continued)

OTHER PUBLICATIONS

International Search Report and the Written Opinion Dated Dec. 30, 2020 From the International Searching Authority Re. Application No. PCT/CN2020/118940, 13 pages.
(Continued)

*Primary Examiner* — Khiem D Nguyen
(74) *Attorney, Agent, or Firm* — BAYES PLLC

(57) ABSTRACT

A display device includes a display layer, a first driving layer, and a second driving layer. The display layer includes a plurality of first pixels disposed in the first display area and a plurality of second pixels disposed in the second display area. The first driving layer includes a plurality of first driving units disposed in the second display area. The second driving layer includes a plurality of second driving units disposed in the second display area and is provided with a plurality of via holes penetrating the second driving layer. The via holes are configured for a plurality of signal
(Continued)

lines to pass through to electrically connect the first driving units and the first pixels. An electronic device includes a display device.

19 Claims, 12 Drawing Sheets

(51) Int. Cl.
*H10K 59/65* (2023.01)
*H10D 86/40* (2025.01)
*H10D 86/60* (2025.01)
*H10K 59/17* (2023.01)

(52) U.S. Cl.
CPC .......... *H10D 86/441* (2025.01); *H10D 86/60* (2025.01); *H10K 59/17* (2023.02)

(58) Field of Classification Search
CPC .. G09G 3/3225; G09G 3/3216; H10D 86/441; H10D 86/60
See application file for complete search history.

(56) References Cited

U.S. PATENT DOCUMENTS

| | | | |
|---|---|---|---|
| 2017/0364188 | A1* | 12/2017 | Bae ................ H10K 59/65 |
| 2018/0300000 | A1* | 10/2018 | Takada ............ G06F 3/0412 |
| 2020/0044004 | A1* | 2/2020 | Wang ............. H10K 50/828 |
| 2020/0052048 | A1* | 2/2020 | Kuo ............... H10K 59/123 |
| 2021/0327958 | A1 | 10/2021 | Li et al. |

FOREIGN PATENT DOCUMENTS

| | | |
|---|---|---|
| CN | 108922900 A | 11/2018 |
| CN | 109065592 A | 12/2018 |
| CN | 208607570 U | 3/2019 |
| CN | 109801903 A | 5/2019 |
| CN | 110189639 A | 8/2019 |
| CN | 110232892 A | 9/2019 |
| CN | 110675825 A | 1/2020 |
| CN | 210516183 U | 5/2020 |
| KR | 20190074859 A | 6/2019 |

OTHER PUBLICATIONS

Notice of allowance dated Apr. 3, 2020 from the CN priority 201921868153.2, 5 pages.
Supplementary Search Report Dated Nov. 10, 2022 From the Extended European search report(EESR) of the Application No. 20882594.3.
The Examination Report dated Nov. 7, 2024 from European patent application No. 20882594.3.
The First Office Action dated Nov. 23, 2024 from Chinese patent application No. 201911050809.4.
The Second Office Action dated Jan. 24, 2025 from the CN priority 201911050809.4.
Notice of allowance dated Mar. 17, 2025 from the CN priority 201911050809.4.

* cited by examiner

DISPLAY DEVICE AND ELECTRONIC DEVICE HAVING DISPLAY LAYER, SECOND DRIVING LAYER, AND FIRST DRIVING LAYER STACKED IN SEQUENCE

CROSS REFERENCE TO RELATED APPLICATIONS

This application is a continuation of International Application No. PCT/CN2020/118940 filed on Sep. 29, 2020, which claims priority to Chinese Patent Application Nos. 201911050809.4 and 201921868153.2, entitled "DISPLAY DEVICE AND ELECTRONIC DEVICE", both of which were filed on Oct. 31, 2019, the entire contents of which are incorporated herein by reference in their entireties.

FIELD OF TECHNOLOGY

The present disclosure relates to the field of electronic technology, and particularly to a display device and an electronic device.

BACKGROUND

With the development of communication technology, electronic devices such as smart phones are becoming more and more popular. During use of the electronic devices, the electronic devices can display images through their display screens. For better display and user experience, sizes of the display screens are getting bigger and bigger. However, when the display screens exceed a certain size, the electronic devices are difficult to hold. Therefore, it is more and more important to increase screen-to-body ratios of the display screens.

In the related art, a camera is disposed on a back of a display device. The display device is provided with a light transmission channel corresponding to the camera, such as a notch or an opening. The camera is configured to obtain external light signals through the light transmission channel for imaging. The light transmission channel occupies an area of a display surface of the display device.

SUMMARY

The present disclosure provides a display device and an electronic device whose screen-to-body ratios are increased.

The present disclosure provides a display device comprising a first display area and a second display area and further comprising a display layer, a first driving layer, and a second driving layer. The display layer comprises a plurality of first pixels disposed in the first display area and a plurality of second pixels disposed in the second display area. The first driving layer comprises a plurality of first driving units disposed in the second display area. The first driving units are configured to drive the first pixels. The second driving layer comprises a plurality of second driving units disposed in the second display area. The second driving layer is provided with a plurality of via holes penetrating the second driving layer in a thickness direction of the second driving layer, wherein the second driving units are configured to drive the second pixels. At least some of the via holes are located in the second display area and are configured for a plurality of signal lines to pass through to electrically connect the first driving units and the first pixels. The display layer, the second driving layer, and the first driving layer are stacked in sequence.

The present disclosure provides an electronic device comprising a display device and a functional device. The display device comprising a first display area and a second display area, and further comprises a display layer, a first driving layer, and a second driving layer. The display layer comprises a plurality of first pixels disposed in the first display area. The first driving layer is disposed below the display layer and comprises a plurality of first driving units disposed in the second display area. The first driving units are configured to drive the first pixels. The second driving layer is disposed between the display layer and the first driving layer. The second driving layer is provided with a plurality of via holes penetrating the second driving layer. The via holes are configured for a plurality of signal lines to pass through to electrically connect the first driving units and the first pixels. The functional device is configured to transmit a light signal through the first display area.

BRIEF DESCRIPTION OF DRAWINGS

In order to more clearly illustrate technical solutions in embodiments of the present disclosure, a brief description of accompanying drawings used in a description of the embodiments will be given below.

DETAILED DESCRIPTION OF EMBODIMENTS

The present disclosure provides a display device and an electronic device. The electronic device may comprise the display device and a camera. The camera may be disposed under the display device. That is, the camera can collect images through the display device. It is understandable that a conventional display device has a relatively low light transmittance, and an effect of the camera collecting images through the display device is not good. In this regard, in the present disclosure, the display device may be partitioned.

For example, a light transmittance of a part of the display device corresponding to the camera is set to be greater than a light transmittance of other portions of the display device, which can improve an effect of the camera collecting images. Technical solutions in embodiments of the present disclosure will be clearly and completely described below in conjunction with accompanying drawings in the embodiments of the present disclosure.

Figure 1:
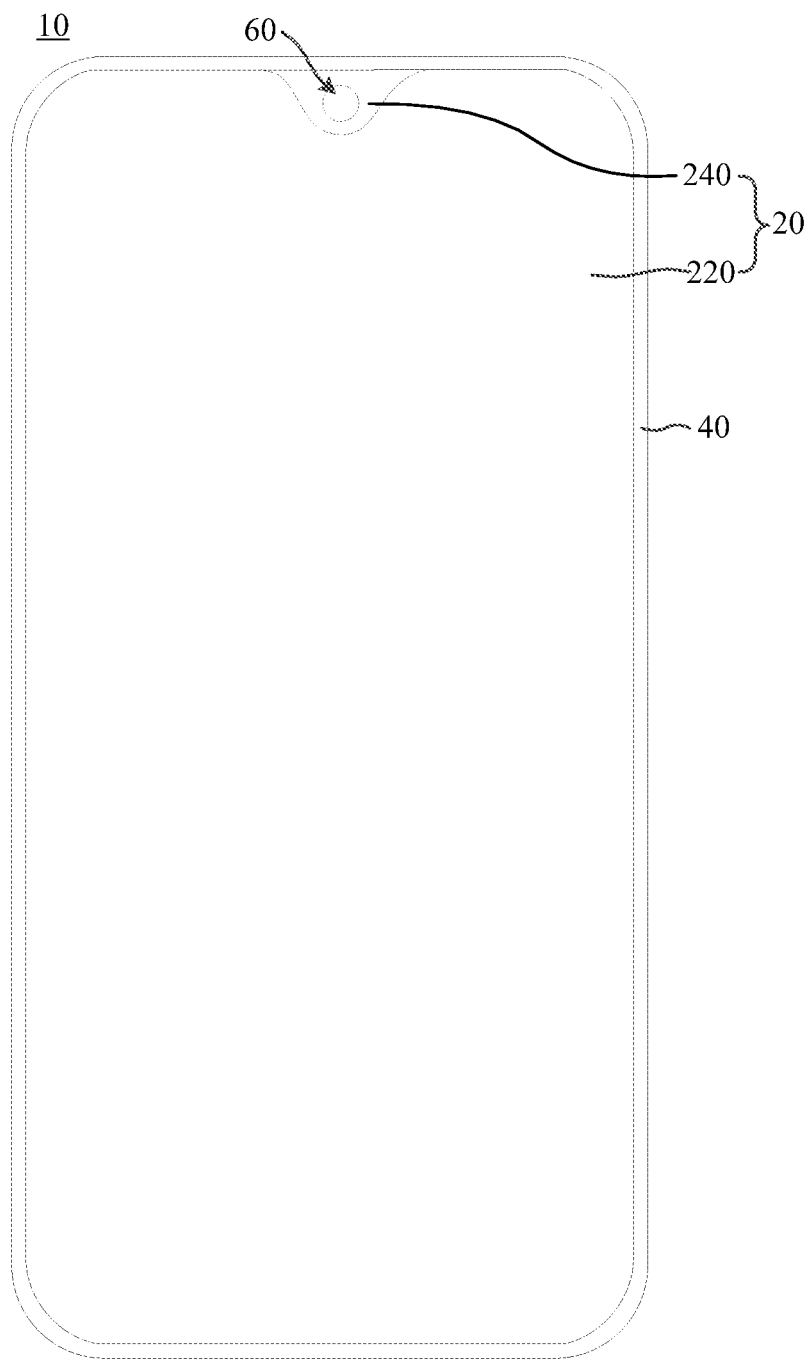
FIG. 1 is a schematic structural diagram of an electronic device according to an embodiment of the present disclosure.

Please refer to FIG. 1. FIG. 1 is a first schematic structural diagram of an electronic device 10 according to an embodiment of the present disclosure. The electronic device 10 may be a computing device such as a handheld or portable electronic device (such as a laptop computer, a computer monitor containing an embedded computer, a tablet computer, a cell phone, or a media player), a small device (such as a wrist watch device, a hanging device, an earphone or earpiece device, a device embedded in a glasses, a device worn on a user's head, or other wearable or miniature device), a televisions, a computer monitor that does not contain an embedded computer, a game device, a navigation device, an embedded system (such as a system in which an electronic device with a display device is installed in a kiosk or a car), a device that implements functions of two or more of the above devices, or other electronic device. In an exemplary configuration of FIG. 1, the electronic device 10 is a portable device, such as a cell phone, a media player, a tablet computer, or other portable computing device. Other configurations are available to the electronic device 10, if desired. FIG. 1 is only exemplary.

It should be understood that a term "a plurality of" mentioned herein means "two or more".

Please refer to FIG. 1, the electronic device 10 comprises a display device 20. The display device 20 can display images. The display device 20 may be an organic light-emitting diode (OLED) display device. A display surface of the display device 20 may have a larger display area and a narrower non-display area. In other words, the display device 20 has a narrower black border. The display surface of the display device 20 may also be a display area, and no non-display area is provided. That is, the display device 20 may have a full screen. A display device cover layer, such as a transparent glass layer, light-transmitting plastic, sapphire, or other transparent dielectric layer, may be used to protect the display device 20.

The display device 20 may have a regular shape, such as a rectangle, a rounded rectangle, or a circle.

In some embodiments, the display device 20 may have an irregular shape, which is not limited in this embodiment.

Figure 2:
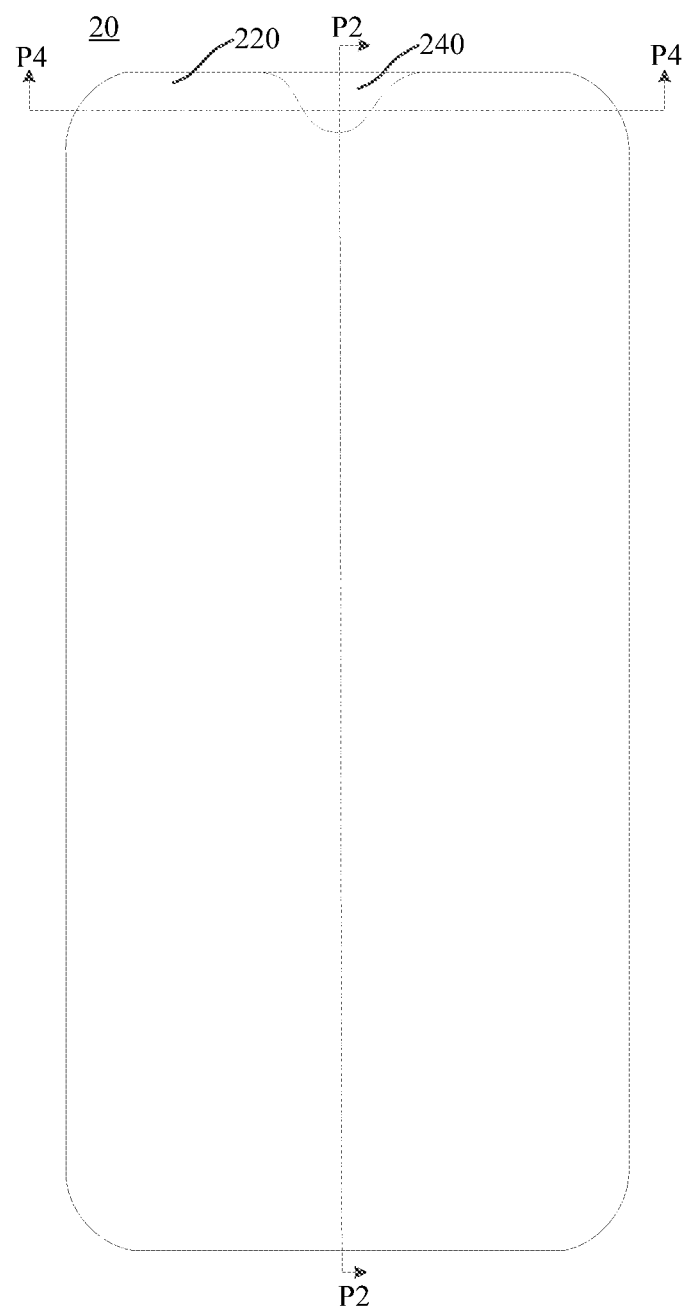
FIG. 2 is a schematic structural diagram of a display device in the electronic device shown in FIG. 1.

Please refer to FIG. 2. FIG. 2 is a schematic structural diagram of the display device 20 in the electronic device 10 shown in FIG. 1. The display device 20 may comprises a first display area 240 and a second display area 220. Both the first display area 240 and the second display area 220 can display images. The first display area 240 and the second display area 220 may display a same image or different images.

The first display area 240 and the second display area 220 may be adjacent to each other.

For example, a periphery of the first display area 240 is surrounded by the second display area 220.

For another example, a part of the first display area 240 is surrounded by the second display area 220, that is, the first display area 240 is located at an end surface or a junction of end surfaces of the display device 20. It can be understood that the junction of the end surfaces of the display device 20 is a position where two end surfaces of the display device 20 are connected to each other, and it may include parts of the two end surfaces connected to each other. It should be noted that there may be one or multiple first display areas 240. When there are multiple first display areas 240, the first display areas 240 may be located on one same end surface of the display device 20, may be located on multiple end surfaces of the display device 20, or may be located on multiple junctions of the end surfaces of the display device 20. Alternatively, some of the first display areas 240 are located at the junctions of the end surfaces of the display device 20, and some of the first display areas 240 are located at the end surfaces of the display device 20.

In this embodiment, an area of the second display area 220 may be set to be greater than an area of the first display area 240. The second display area 220 may be used as a main display area of the display device 20. The first display area 240 may be used as an auxiliary display area or a function display area of the display device 20.

For example, a light transmittance of the first display area 240 may be set to be greater than a light transmittance of the second display area 220. thereby greatly improving the light transmittance of the first display area 240 in a non-display state of the first display area 240. A functional component of the electronic device 10, such as a camera 60, a sensor, or other component, may be disposed in the first display area 240 to improve a quality of signal transmission of the camera 60, the sensor, or other device through the first display area 240.

It should be noted that in some embodiments, the area of the first display area 240 and the area of the second display area 220 may be set to be same, or the area of the first display area 240 may be set to be greater than the area of the second display area 220.

In this embodiment, the functional component such as the camera 60 or the sensor may be disposed at a corresponding position of the first display area 240 (such as under the first display area 240). When the first display area 240 is in the non-display state, the functional component such as the camera 60 or the sensor can perform signal transmission (such as image collection) through the first display area 240. Furthermore, the first display area 240 can also display images according to requirements, so that an integrity of the display device 20 and an integrity of a display area are realized. This not only realizes a hidden design of the functional component such as the camera 60 or the sensor, but also increases a screen-to-body ratio of the electronic device 10.

It should be noted that the functional component of the electronic device 10, such as the camera 60 or the sensor, is not limited to be disposed under the first display area 240, and it may be disposed away from the first display area 240. A light guide rod may be disposed between the functional component, such as the camera 60 or the sensor, and the first display area 240 to realize signal transmission. The light guide rod can transmit light signals emitted by the functional component, such as the camera 60 or the sensor, to the first display area 240 and transmit the light signals to an outside of the electronic device 10 through the first display area 240. The light guide rod can also transmit an external light signal passing through the first display area 240 to the functional component such as the camera 60 or the sensor. The light guide rod may have a cylindrical structure or a multi-segment structure. When the light guide rod has a multi-segment structure, it may have at least one light guide surface to realize reflection of the light signals.

In order to set the light transmittance of the first display area 240 to be greater than the light transmittance of the second display area 220, in this embodiment, driving units such as thin film transistors (TFTs) in the display device 20 that drive the first display area 240 may be disposed outside the first display area 240.

For example, the driving units are disposed in a driving layer that is disposed in the display device 20 to drive the second display area 220. For another example, the driving units are disposed on a side or a periphery of the display device 20. For yet another example, the driving units are disposed in a non-display area of the display device 20. For still another example, a double-layer driving structure is disposed in the display device 20, and the driving units such as TFTs driving the first display area 240 are disposed in a part of the double-layer driving structure corresponding to the second display area 220 through via holes.

Figure 3:
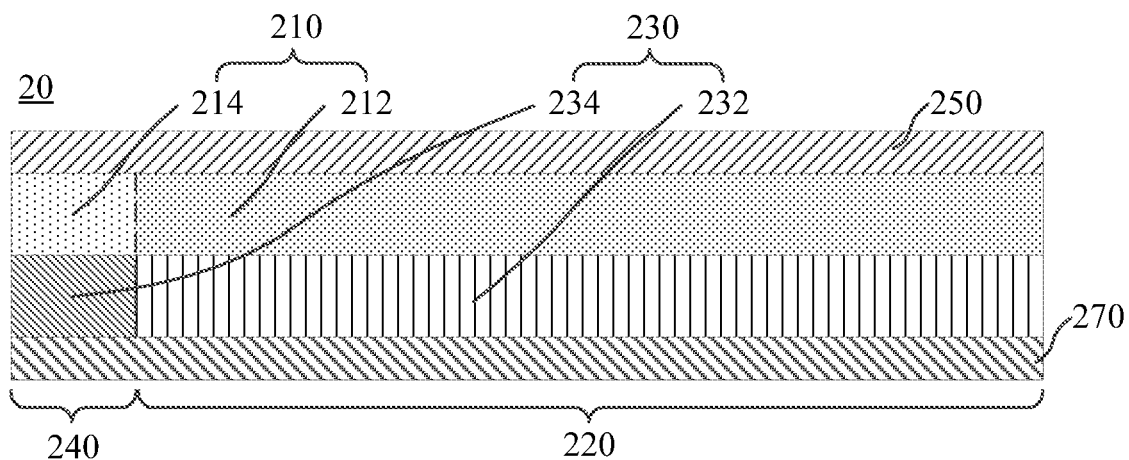
FIG. 3 is a cross-sectional view of the display device shown in FIG. 2 along a line P2-P2.

Please refer to FIG. 3. FIG. 3 is a cross-sectional view of the display device 20 shown in FIG. 2 along a line P2-P2. The display device 20 may include an upper substrate 250, a display layer 210, a driving layer 230, and a lower substrate 270 that are sequentially stacked. In the display device 20, the driving layer 230 drives the display layer 210 to display images. Both the upper substrate 250 and the lower substrate 270 may be made of a transparent material, such as transparent glass. The lower substrate 270 may be defined as a first substrate, and the upper substrate 250 may be defined as a second substrate.

Figure 4:
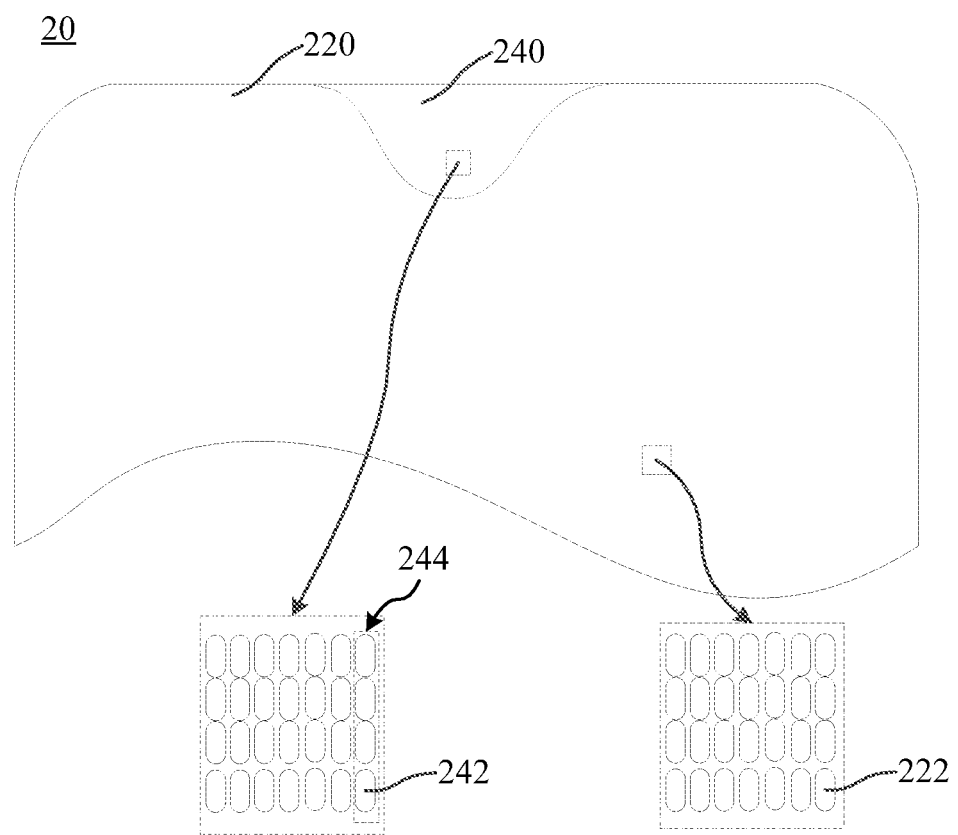
FIG. 4 is a partial schematic diagram of the display device shown in FIG. 2.

Please refer to FIG. 3 and FIG. 4. FIG. 4 is a partial schematic diagram of the display device shown in FIG. 2. The display layer 210 may include multiple pixels. The display layer 210 includes a second display portion 212 located in the second display area 220 and a first display portion 214 located in the first display area 240. That is, the display layer 210 may include a plurality of second pixels 222 disposed in the second display area 220 and a plurality of first pixels 242 disposed in the first display area 240. The second pixels 222 may be disposed in an array, and the first pixels 242 may be disposed in an array. An arrangement of the first pixels 242 in the first display area 240 may be a standard RGB arrangement, a Pentile arrangement, or a Delta arrangement. An arrangement of the second pixels 222 in the second display area 220 may be a standard RGB arrangement, a Pentile arrangement, or a Delta arrangement.

It should be noted that the first pixels 242 in the first display area 240 may be arranged in other ways, and the second pixels 222 in the second display area 220 may also be arranged in other ways.

Please refer to FIG. 3. It can be understood that the first display portion 214 and the second display portion 212 are only used to define positions of portions of the display layer 210. The first display portion 214 may include pixels, and the second display portion 212 may also include pixels. Both the first display portion 214 and the second display portion 212 have a same function as the display layer 210.

Please refer to FIG. 3 and FIG. 4. In order to further increase the light transmittance of the first display area 240, the first pixels 242 in the first display area 240 may be made of a light-transmitting material in this embodiment.

In some embodiments, the first pixels 242 may be arranged more sparsely than the second pixels 222. That is, an arrangement density of the first pixels 242 may be less than an arrangement density of the second pixels 222.

The driving layer 230 may include multiple driving units. Each driving unit can drive at least one pixel. The driving layer 230 includes a plurality of first driving units for driving the first display area 240 and a plurality of second driving units for driving the second display area 220. Each of the first driving units may be electrically connected to one first pixel 242 and can drive one first pixel 242. Each of the second driving units may be electrically connected to one second pixel 222 and can drive one second pixel 222. The driving layer 230 may further include a second driving portion 232 located in the second display area 220 and a first driving portion 234 located in the first display area 240. The second driving units may be disposed in the second driving portion 232, and the first driving units may be disposed in the first driving portion 234.

The driving units may adopt one of 2T1C, 5T1C, 7T1C, and other driving circuit.

For example, the first driving units may adopt 2T1C, 5T1C, or 7T1C. The second driving units may adopt 2T1C, 5T1C, or 7T1C. T represents a thin film transistor, and C represents a capacitor. In order to increase the light transmittance of the first display area 240, a driving circuit of each of the first driving units in the first display area 240 may be simpler than a driving circuit of each of the second driving units in the second display area 220.

For example, a number of thin film transistors in each of the first driving units is less than a number of thin film transistors in each of the second driving units.

For example, the first driving units may adopt 2T1C or 5T1C, and the second driving unit may adopt 7T1C. The fewer the number of opaque thin film transistors in each of the first driving units, the less the opaque parts of the first display area 240. Therefore, the light transmittance of the first display area 240 is increased.

A physical structure of each of the second pixels 222 in the second display area 220 may be same as a physical structure of each of the first pixels 242 in the first display area 240. In other words, the second display area 220 may have a same pixel physical structure as the first display area 240.

For example, a size of each of the second pixels 222 is same as a size of each of the first pixels 242, and an arrangement of the second pixel 222 is same as an arrangement of the first pixel 242. The second pixel 222 and the first pixel 242 may be formed in a same process. It should be noted that the physical structure of each of the second pixels 222 in the second display area 220 may be different from the physical structure of each of the first pixels 242 in the first display area 240.

For example, the size of each of the second pixels 222 is greater than the size of each of the first pixels 242. For another example, the arrangement density of the second pixels 222 is greater than the arrangement density of the first pixels 242. It should be noted that FIG. 4 only shows some pixels of the display device 20. In FIG. 4, a size of a region formed by the arranged first pixels 242 is substantially same as a size of a region formed by the arranged second pixels 222.

The first display area 240 may have a plurality of first pixel groups 244. Each of the first pixel groups 244 may include some of the first pixels 242 connected in parallel. In other words, some of first pixels 242 are connected in parallel to form one first pixel group 244. One first pixel group 244 may include at least two first pixels 242. The at least two first pixels 242 in one first pixel group 244 may have a same color, for example, may be red pixels. The at least two first pixels 242 in one first pixel group 244 may have different colors, for example, may be red pixels and green pixels. The first pixels 242 in one first pixel group 244 may be connected together by a plurality of signal lines. The signal lines may be made of a light-transmitting material.

Figure 5:
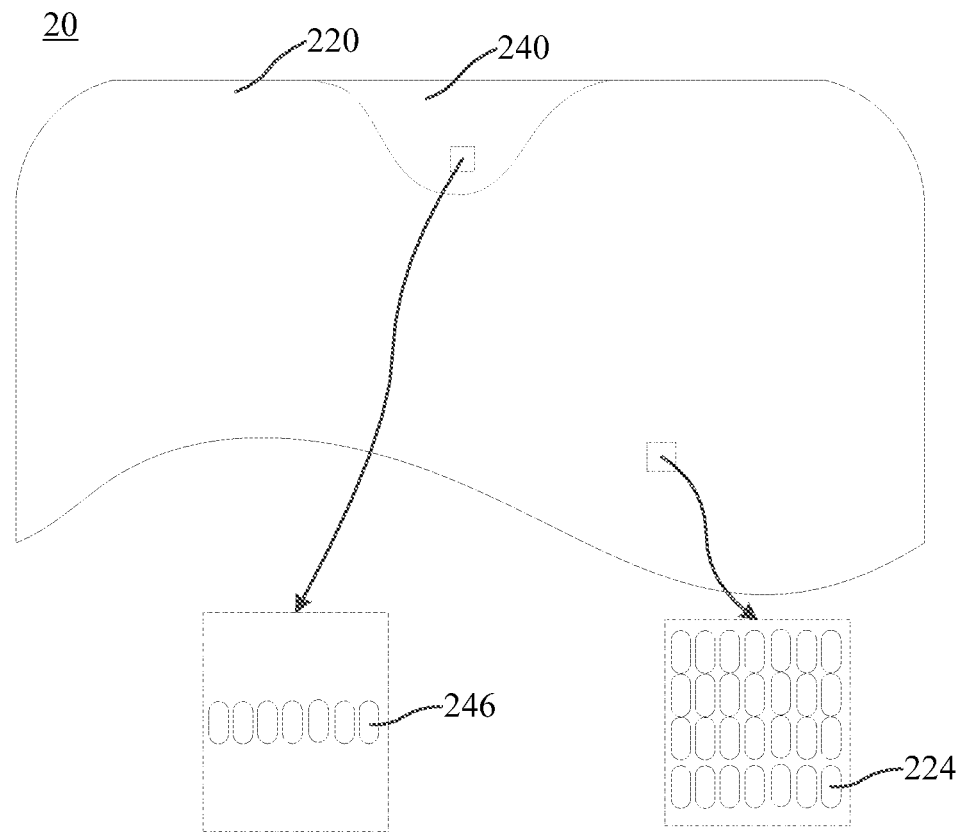
FIG. 5 is another partial schematic diagram of the display device shown in FIG. 2.

Please refer to FIG. 5. FIG. 5 is another partial schematic diagram of the display device 20 shown in FIG. 2. FIG. 5 shows the second driving units 224 in the second display area 220 and the first driving units 246 in the first display area 240. Each of the second driving units 224 may be electrically connected to one second pixel 222. Each of the second driving units 224 may drive one second pixel 222. Each of the first pixel group 244 may be electrically connected to one first driving unit 246. Each of the first driving units 246 may drive one first pixel group 244. That is, each of the first driving units 246 may drive all the first pixels 242 in one first pixel group 244. Compared with one driving unit driving one pixel, this embodiment reduces a number of first driving units 246. In this embodiment, the first driving units 246 may be disposed in the first display area 240, for example, in the first driving portion 234. Because fewer first driving units 246 are configured to drive the first pixels 242 in the first display area 240, the light transmittance of the first display area 240 is improved. It should be noted that FIG. 5 only shows some of the second driving units 224 and some of the first driving units 246 in the display device 20. In FIG. 5, a size of a region formed by the arranged first driving units 246 is substantially same as a size of a region formed by the arranged second driving units 224.

In this embodiment, each of the first pixel groups 244 may be used as a first display unit in the first display area 240, that is, a smallest unit for displaying images in the first display area 240.

For example, each of the first pixel groups 244 as one first display unit includes four first pixels 242 of a same color, or sixteen first pixels 242 of a same color. For another example, each of the first pixel groups 244 as one first display unit includes multiple first pixels 242 with different colors. The second pixels 222 in the second display area 220 may form a second display unit, or a second pixel unit.

For example, the second pixel unit in the second display area 220 includes a red pixel, a green pixel, and a blue pixel. The second pixel unit in the second display area 220 may further include other pixel, such as a white pixel or a yellow pixel.

In this embodiment, multiple first pixel groups 244 may be used as one first display unit.

For example, three first pixel groups 244 may be used as one first display unit. For another example, four first pixel groups 244 may be used as one first display unit. Each of the first pixel groups 244 in one first display unit may include four first pixels 242 of the same color or sixteen first pixels 242 of the same color.

For example, one first display unit includes three first pixel groups 244. Among the three first pixel groups 244, one first pixel group 244 includes four red pixels, another first pixel group 244 includes four green pixels, and the other first pixel group 244 includes four blue pixels.

Figure 6:
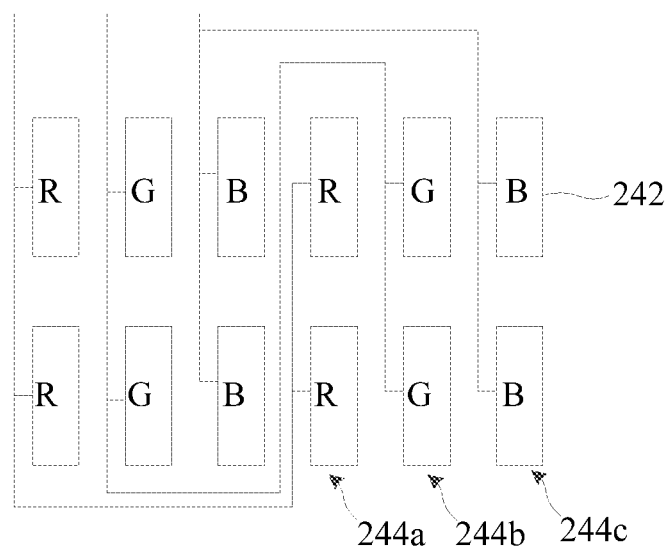
FIG. 6 is a schematic diagram of a first arrangement of a first display unit in a first display area of the display device shown in FIG. 2.

Please refer to FIG. 6. FIG. 6 is a schematic diagram of a first arrangement of a first display unit in a first display area of the display device shown in FIG. 2. One first display unit 216a in the first display area 240 may include three first pixel groups 244, which may be a first pixel group 244a, a first pixel group 244b, and a first pixel group 244c. The first pixel group 244a may include four red pixels 242 (R). The first pixel group 244b may include four green pixels 242 (G). The first pixel group 244c may include four blue pixels 242 (B). It should be noted that an arrangement of multiple first pixel groups in one first display unit is not limited to this arrangement.

Figure 7:
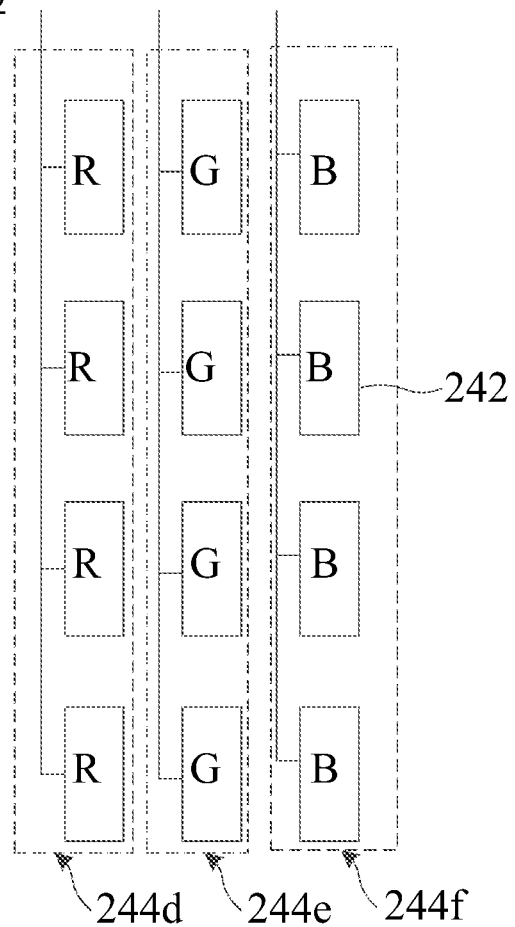
FIG. 7 is a schematic diagram of a second arrangement of the first display unit in the first display area of the display device shown in FIG. 2.

Please refer to FIG. 7. FIG. 7 is a schematic diagram of a second arrangement of the first display unit in the first display area of the display device shown in FIG. 2. One first display unit 216b in the first display area 240 may include three first pixel groups 244, which may be a first pixel group 244d, a first pixel group 244e, and a first pixel group 244f. The first pixel group 244d may include four red pixels 242 (R). The first pixel group 244e may include four green pixels 242(G). The first pixel group 244f may include four blue pixels 242 (B).

Figure 8:
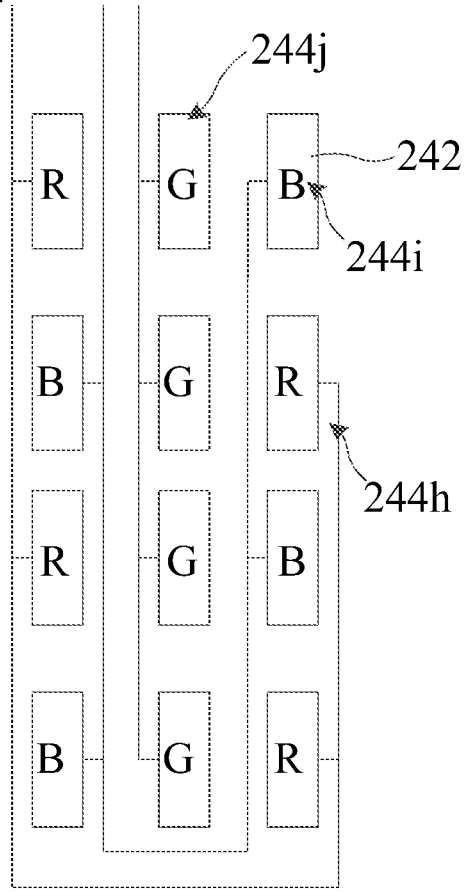
FIG. 8 is a schematic diagram of a third arrangement of the first display unit in the first display area of the display device shown in FIG. 2.

FIG. 8 is a schematic diagram of a third arrangement of the first display unit in the first display area of the display device shown in FIG. 2. One first display unit 216c in the first display area 240 may include three first pixel groups 244, which may be a first pixel group 244h, a first pixel group 244i, and a first pixel group 244j. The first pixel group 244h may include four red pixels 242 (R). The first pixel group 244i may include four green pixels 242(G). The first pixel group 244j may include four blue pixels 242 (B).

Figure 9:
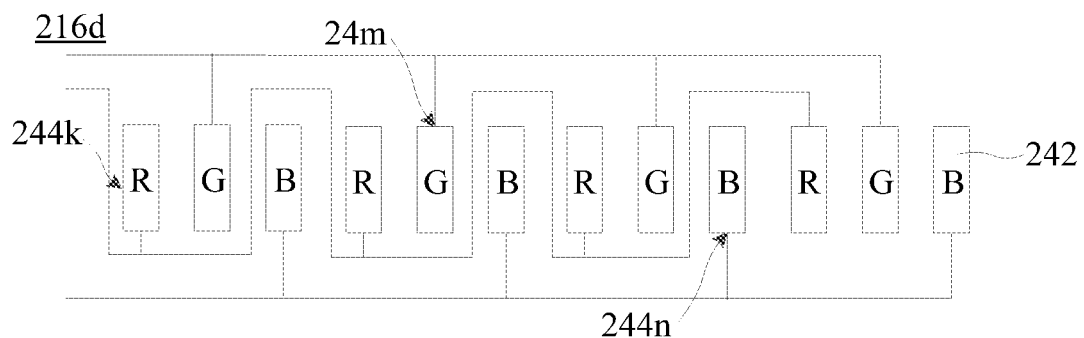
FIG. 9 is a schematic diagram of a fourth arrangement of the first display unit in the first display area of the display device shown in FIG. 2.

FIG. 9 is a schematic diagram of a fourth arrangement of the first display unit in the first display area of the display device shown in FIG. 2. One first display unit 216d in the first display area 240 may include three first pixel groups 244, which may be a first pixel group 244k, a first pixel group 244m, and a first pixel group 244n. The first pixel group 244k may include four red pixels 242 (R). The first pixel group 244m may include four green pixels 242(G). The first pixel group 244n may include four blue pixels 242 (B).

It can be understood that when one first display unit in the first display area 240 includes four first pixel groups 244, the first pixels 242 in each of the four first pixel groups 244 have a same color.

For example, one first pixel group 244 includes a plurality of red pixels, another first pixel group 244 includes a plurality of green pixels, yet another first pixel group 244 includes a plurality of blue pixels, and the other first pixel group 244 includes a plurality of white pixels. Alternatively, the other first pixel group 244 includes a plurality of yellow pixels.

FIG. 6 to FIG. 9 only show some arrangements of one first display unit in the first display area 240 of the display device 20. In this embodiment, one first display unit in the first display area 240 may have other arrangements.

It should be noted that, in some solutions, in order to improve the light transmittance of the first display area, the size of the first pixels in the first display area may be set to be greater than the size of the second pixels in the second display area, and the first pixels in the first display area may be arranged more sparsely than the second pixels in the second display area. Therefore, the first pixels in the first display area and the second pixels in the second display area have different pixel physical structures. In an actual manufacturing process, because the first pixels in the first display area and the second pixels in the second display area have different pixel physical structures, the pixel physical structures need to be formed through a series of processes such as exposure, development, and cleaning using different masks.

For example, the first pixels in the first display area need to be formed by a first type of mask through a first set of processes. The second pixels in the second display area need to be formed by a second type of mask through a second set of processes. This not only requires additional masks and tools, but also increases processes, increases processing cost and complexity, and reduces a yield of the pixels formed.

In order to save tools and processes, the first pixels in the first display area and the second pixels in the second display area may be formed with a same tool, such as a mask, in a same process, so that the physical structure of each of the first pixels in the first display area is same as the physical structure of each of the second pixels in the second display area. However, when the physical structure of each of the first pixels in the first display area is same as the physical structure of each of the second pixels in the second display area, and the first pixels in the first display area and the second pixels in the second display area are driven in a same way, the first display area needs to be provided with too many wires and the first driving units. Too many wires will affect the light transmittance of the first display area.

In another solution, in order to reduce processes, process cost, and a number of signal lines in the first display area, facilitate an arrangement of the signal lines in the first display area, and improve the light transmittance of the first display area, In this embodiment, at least two first pixels in the first display area are connected in parallel to form one first pixel group. Multiple first pixels may be connected to one same signal line after being connected in parallel. Compared with each first pixel being connected to one signal line, the number of the signal lines may be greatly saved, the arrangement of the signal lines is facilitated, and the light transmittance of the first display area is improved.

Accordingly, in this embodiment, at least two first pixels in the first display area are connected in parallel to form one first pixel group, which changes a wiring in a part of the display layer in the first display area without changing a pixel physical structure of the entire display device, so as to greatly reduce the number of the signal lines arranged in the first display area, thereby improving the light transmittance of the first display area.

In order to further improve the light transmittance of the first display area 240, some of all the first driving units for driving the first display area 240 may be disposed in the first display area 240, and others may be disposed in other positions, such as the second display area 220.

For example, some of the first driving units are disposed in the first driving portion 234, and the others are disposed in the second driving portion 232.

In this embodiment, all the first driving units for driving the first display area 240 may be disposed in other positions.

For example, all the first driving units may be disposed in the second display area 220.

It should be noted that if the first driving units 246 for driving the first pixels 242 in the first display area 240 is disposed in the second display area 220, such as the second driving portion 232, wires need to be disposed. Considering that the wires will occupy a space where the first display area 240 and the second display area 220 are connected, if there are too many wires, the space may not be enough to dispose the wires, and it is necessary to increase a thickness of the driving layer 230 to dispose more wires. In order not to increase the thickness of the driving layer 230 where the wires are located, and to ensure that there is enough space for wiring at a connection between the first display area 240 and the second display area 220. At least two first pixels 242 in the first display area 240 may be connected in parallel to form one first pixel group 244 and then connected to one same signal line, which can greatly reduce the number of the signal lines and the space occupied by the signal lines. Therefore, the first driving units 246 for driving the first pixels 242 in the first display area 240 are disposed in the second display area 220.

However, considering that the second display area 220 is the main display area of the display device 20, if all the first driving units 246 for driving the first display area 240 are disposed in the second display area 220, a setting of the second driving portion 232 in the second display area 240 will be affected, and a wiring process of the second driving portion 232 be affected. This may affect a quality and effect of images displayed in the second display area 220. In this embodiment, in order to reduce an influence of the first driving units 246 on the second display area 220, a third display area may be disposed between the second display area 220 and the first display area 240 to form a transition area. The first driving units 246 may be disposed in the third display area to reduce the influence of the first driving units 246 on the second display area 220.

Figure 10:
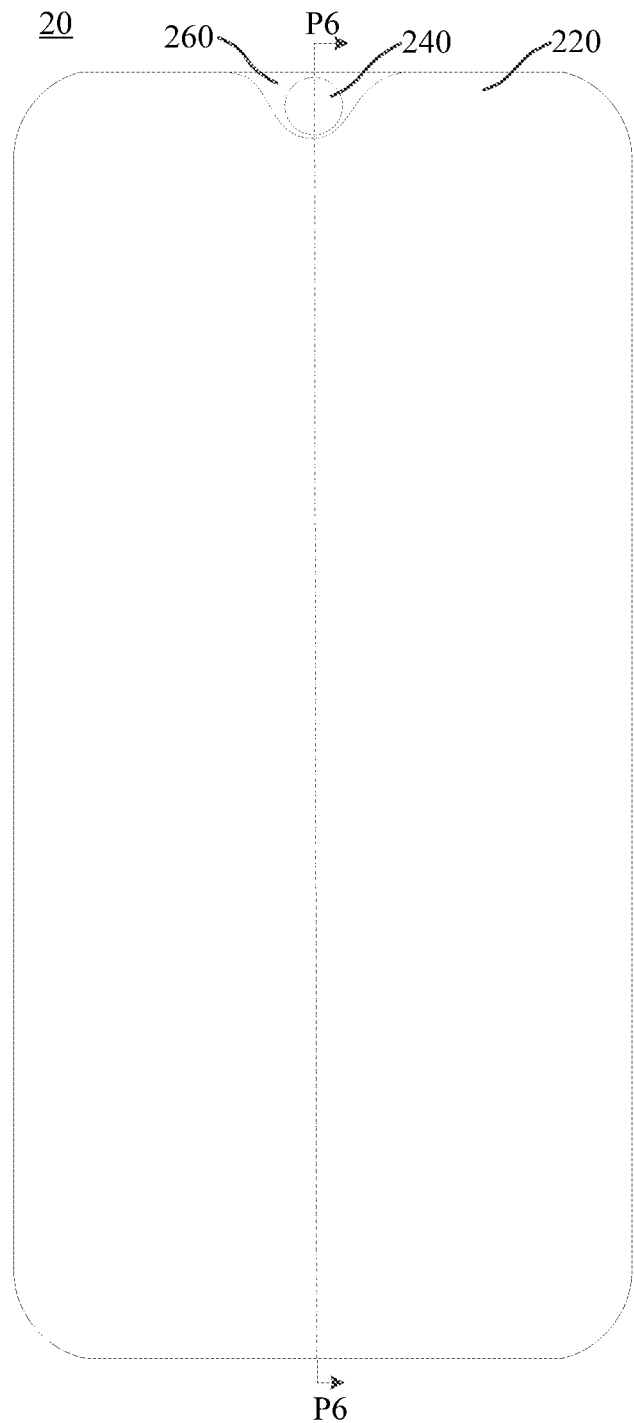
FIG. 10 is another schematic structural diagram of the display device according to an embodiment of the present disclosure.

Please refer to FIG. 10. FIG. 10 is another schematic structural diagram of the display device according to an embodiment of the present disclosure. The display device 20 may further include a third display area 260, which may also be referred to as a transition area. The third display area 260 may connect the second display area 220 and the first display area 240. The third display area 260 may be connected between the second display area 220 and the first display area 240. In this embodiment, the third display area 260 may separate the second display area 220 from the first display area 240, so that the second display area 220 and the first display area 240 are not directly connected. In this embodiment, the third display area 260 may be connected to a part of the second display area 220 and a part of the first display area 240, and the other part of the second display area 220 may be connected to the other part of the first display area 240. A size of the third display area 260 may be much less than a size of the second display area 220. The first display area 240 and the third display area 260 may together form an auxiliary display area of the display device 20. The first display area 240 and the third display area 260 may be defined as auxiliary display areas, or function display areas.

Figure 11:
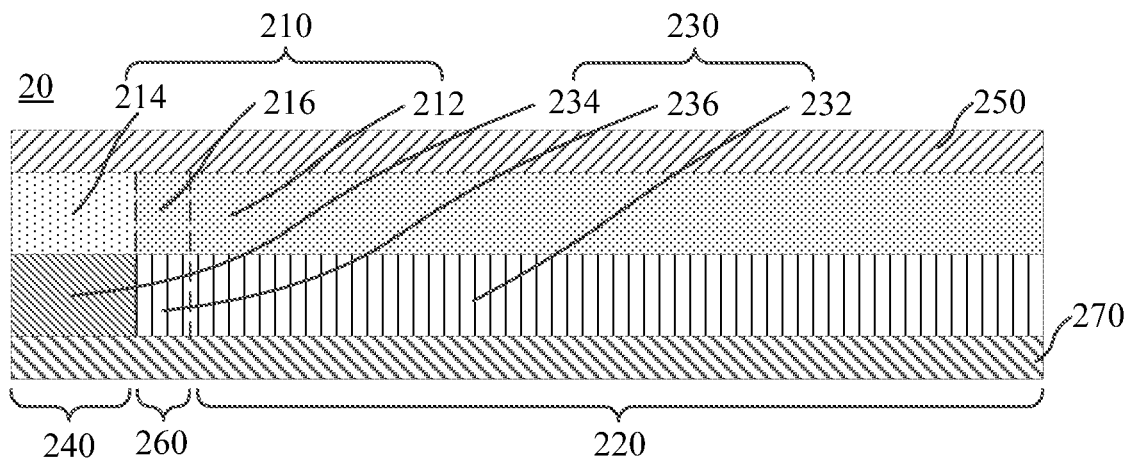
FIG. 11 is a cross-sectional view of the display device shown in FIG. 10 along a line P6-P6.

Please refer to FIG. 11. FIG. 11 is a cross-sectional view of the display device shown in FIG. 10 along a line P6-P6. The display layer 210 may further include a third display portion 216 in the third display area 260. The third display part 216 may be provided with a plurality of third pixels. An arrangement of the third pixels may be a standard RGB arrangement, a Pentile arrangement, or a Delta arrangement. The third pixels may be arranged in other ways. The driving layer 230 may further include a third driving portion 236. The third driving portion 236 may be provided with a plurality of driving units.

For example, the third driving portion 236 is provided with a plurality of third driving units, each of the third driving units may be electrically connected to one third pixel, and each of the third driving units may drive one third pixel. The third driving units may adopt 2T1C, 5T1C, or 7T1C.

For example, the third drive units adopt 5T1C. In this embodiment, the third display area 260 may adopt 5T1C, the first display area 240 may adopt 2T1C, and the second display area 220 may adopt 7T1C, so that the quality of the images displayed in the second display area 220 is greater than a quality of images displayed in the third display area 260, and the quality of the images displayed in the third display area 260 is greater than a quality of images displayed in the first display area 240. Therefore, a transition is presented between the first display area 240 and the second display area 220.

Driving manners of the first display area 240, the second display area 220, and the third display area 260 are not limited to the above driving manners.

For example, the first display area 240 and the third display area 260 both adopt 5T1C, and the second display area 220 adopts 7T1C.

Figure 12:
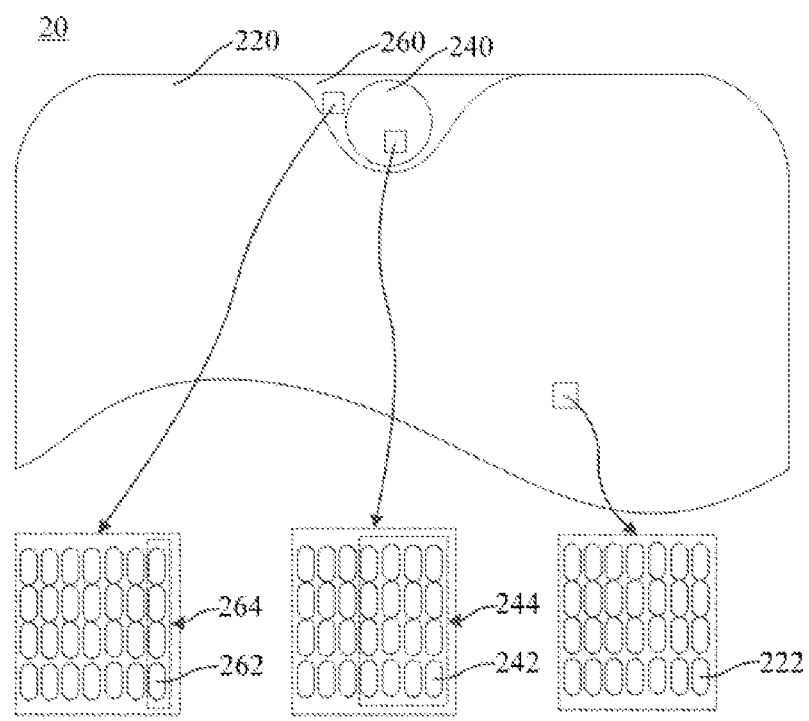
FIG. 12 is a first partial schematic diagram of the display device shown in FIG. 10.

Please refer to FIG. 12. FIG. 12 is a first partial schematic diagram of the display device shown in FIG. 10. An arrangement of the third pixels 262 in the third display area 260 may be same as the arrangement of the second pixels 222 in the second display area 220, and may also be same as the arrangement of the first pixels 242 in the first display area 240.

For example, the second display area 220, the third display area 260, and the first display area 240 have a same pixel physical structure. The pixels in the second display area 220, the third display area 260, and the first display area 240 may be formed in a same process. It should be noted that the arrangement of the third pixels 262 in the third display area 260 may be different from the arrangement of the second pixels 222 in the second display area 220 or the arrangement of the first pixels 242 in the first display area 240. It should be noted that FIG. 11 only shows some pixels of the display device 20. In FIG. 11, a size of a region formed by the arranged first pixels 242, a size of a region formed by the arranged third pixels 262, and a size of a region formed by the arranged second pixels 222 are substantially same.

In this embodiment, all the first driving units 246 for driving the first display area 240 may be disposed in the third display area 260.

For example, the first driving units 246 are disposed in the third display portion 236, so that a part of the driving layer 230 in the first display area 240 has no first driving units 246.

For example, the first driving portion 234 in the first display area 240 has no thin film transistors. This can greatly improve the light transmittance of the first display area 240. Furthermore, this can avoid other problems caused by disposing the first driving units in the first display area 240, such as diffraction caused by the periodically arranged first driving units 246 to imaging of the camera 60, and stray light caused by reflection and refraction of the first driving units 246 to the imaging of the camera 60.

It should be noted that, the third display area 260 is provided with the third driving units, and the third driving units occupy a space of the third driving portion 236. In the present disclosure, the first driving units disposed in the third driving portion 236 also occupy the space of the third driving portion 236, and signal lines also occupy the space of the third driving portion 236. In order to ensure that the first driving units can be disposed in the third driving portion 236, the signal lines in the third driving portion 236 may be set thinner, thereby reducing a space occupied by each signal line and accommodating more signal lines.

In this embodiment, a number of third driving units in the third display area 260 may be reduced, so that the first driving units can be disposed in the third driving portion 236 without changing a thickness of the signal lines in the third driving portion 236, and the wiring requirements can be met.

Please refer to FIG. 12, the third display area 260 may be provided with a plurality of third pixel groups 264. Each of the third pixel groups 264 may include at least two third pixels 262 connected in parallel, and may include at least two third pixels 262 of a same color, such as red pixels. Each of the third pixel groups 264 may include at least two third pixels 262 of different colors, such as red pixels and green pixels. The third pixels 262 in one third pixel group 264 may be connected together by a plurality of signal lines. A number of the third pixels 262 in each of the third pixel groups 264 may be more than a number of the first pixels 242 in each of the first pixel groups 244.

For example, each of the third pixel groups 264 includes four third pixels 262, and each of the first pixel groups 244 includes sixteen first pixels 242.

In addition, the number of the third pixels 262 in each of the third pixel groups 264 may be same as the number of the first pixels 242 in each of the first pixel groups 244.

In this embodiment, each of the third pixel groups 264 may be used as a third display unit in the third display area 260.

For example, each of the third pixel groups 264 as one third display unit includes two third pixels 262 of the same color, or four third pixels 262 of the same color. For another example, each of the third pixel groups 264 as one third display unit includes multiple third pixels 262 with different colors.

In this embodiment, multiple third pixel groups 264 may be used as one third display unit.

For example, three third pixel groups 264 may be used as one third display unit. For another example, four third pixel groups 264 may be used as one third display unit. Each of the third pixel groups 264 in one third display unit may include two third pixels 262 of the same color or four third pixels 262 of the same color.

For example, one third display unit includes three third pixel groups 264. Among the three third pixel groups 264, one third pixel group 264 includes four red pixels, another third pixel group 264 includes four green pixels, and the other third pixel group 264 includes four blue pixels. Regarding a number of the third pixel groups 264 included in one third display unit and an arrangement of the third pixels 262 in one third display unit, reference may be made to structures of the first display unit shown in FIG. 6 to FIG. 9, which will not be described in detail herein.

It can be understood that when one first display unit in the third display area 260 includes four third pixel groups 264, the first pixels 242 in each of the four third pixel groups 264 have a same color.

For example, one third pixel group 264 includes a plurality of red pixels, another third pixel group 264 includes a plurality of green pixels, yet another third pixel group 264 includes a plurality of blue pixels, and the other third pixel group 264 includes a plurality of white pixels. Alternatively, the other third pixel group 264 includes a plurality of yellow pixels.

Figure 13:
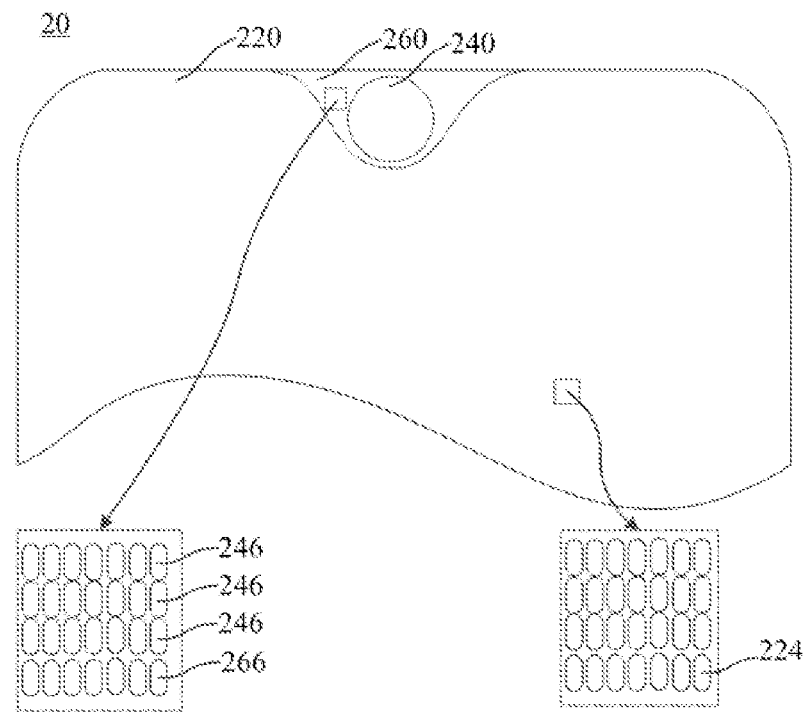
FIG. 13 is a second partial schematic diagram of the display device shown in FIG. 10.

Please refer to FIG. 13. FIG. 13 is a second partial schematic diagram of the display device shown in FIG. 10. FIG. 13 shows the second driving units 224 in the second display area 220, and the third driving units 266 and the first driving units 246 in the third display area 260. For the second driving units 224, please refer to the above description of FIG. 5, which will not be described in detail herein. The third driving units 266 and the first driving units 246 are disposed in the third display area 260, for example, in the third driving portion 236.

The third driving units 266 are configured to drive the third display area 260. Each of the third driving units 266 may be electrically connected to one third pixel group 264. Each of the third driving units 266 may drive one third pixel group 264. That is, each of the third driving units 266 may drive all the third pixels 262 in one third pixel group 264. Compared with one driving unit driving one pixel, this embodiment reduces a number of third driving units 266, thereby reducing a space of the third driving portion 236 occupied by the third driving units 266, so as to dispose the first driving units 246.

For example, each of the third driving units 266 includes four third pixels 262 connected in parallel. One third driving unit 266 may occupy a space of the third driving portion 236 corresponding to one third pixel 262, or a space of the third driving portion 236 slightly smaller than the space of the third driving portion 236 corresponding to the third pixel 262. Therefore, for one third pixel group 264, the third driving portion 236 may have empty spaces corresponding to at least three third pixels 262. Multiple first driving units 246, such as three first driving units 246, may be disposed in the empty spaces. The empty spaces corresponding to the three third pixels 262 may be in a one-to-one correspondence with the three first driving units 246.

Accordingly, in this embodiment, at least two third pixels 262 in the third display area 260 may be connected in parallel to form one third pixel group 264, the third pixels 262 in one third pixel group 264 may be driven by one third driving unit 266, so that sufficient space is reserved in the third driving portion 236 for disposing the first driving units 246. Therefore, opaque thin film transistors in the first display area 240 may be disposed in the third display area 260 that does not need to collect light signals through cameras and the like. The size of the third display area 260 may be set smaller, and connects the first display area 240 and the second display area 220. Therefore, under a condition that images displayed in the second display area 220 is not greatly affected, a deterioration of a quality of images displayed in the third display area 260 will not have a significant impact on a display effect of the entire display device 20.

In addition, a number of the third pixels 262 connected in parallel in the third display area 260 may be less than a number of the first pixels 242 connected in parallel in the first display area 240, so that a display transition between the first display area 240 and the second display area 220 is smoother.

It should be noted that, in this embodiment, the first driving units 246 are not limited to be disposed in the third display area 260.

For example, some of the first driving units 246 are disposed in the third display area 260, and the other first driving units 246 are disposed in the first display area 240. For another example, some of the first driving units 246 are disposed in the third display area 260, and the other first driving units 246 are disposed in the second display area 220. For yet another example, the first driving units 246 are divided into three parts, which are disposed in the first display area 240, the third display area 260, and the second display area 220, respectively.

It should also be noted that, in this embodiment, the first driving units 246 are not limited to be disposed in a display area. The first driving units 246 may be disposed in a side or a non-display area of the display device 20.

Figure 14:
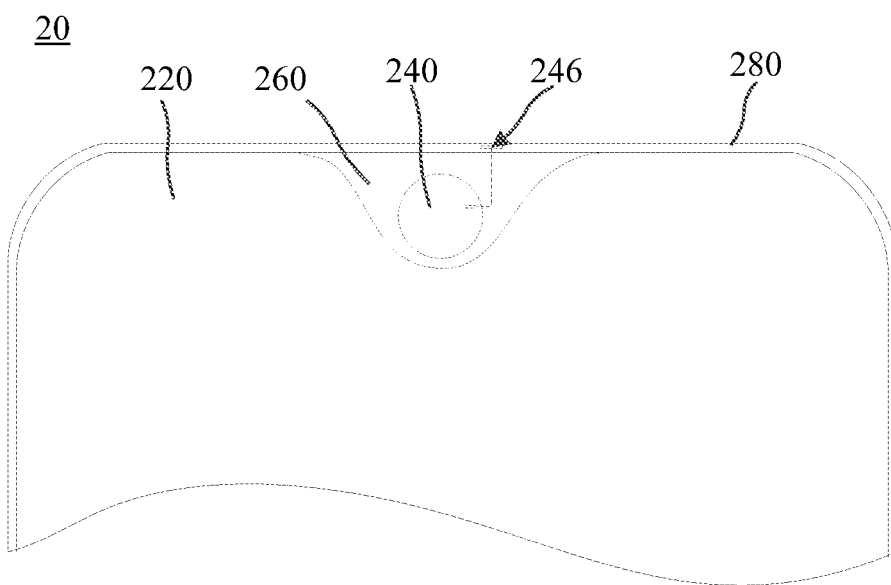
FIG. 14 is a third partial schematic diagram of the display device shown in FIG. 10.

Please refer to FIG. 14. FIG. 14 is a third partial schematic diagram of the display device shown in FIG. 10. The display device 20 may further include a non-display area 280. The first driving units 246 for driving the first display area 240 may be disposed in the non-display area 280. The display device 20 may have a full screen. That is, a front surface of the display device 20 is substantially a display area. Viewed from a front surface of the electronic device 10, the front surface of the display device 20 is substantially equal to a display surface of the electronic device 10. However, even if the display device 20 has a full screen, the non-display area 280 still exists at an edge of the display device 20. The non-display area 280 may be understood as a black border of the display device 20. A width of the black border may be very narrow, for example, the width of the black border is less than 1 mm, 0.5 mm, or the like. Because the area of the first display area 240 is small, a number of the first pixels 242 in the first display area 240 is relatively small. Furthermore, multiple first pixels 242 in the first display area 240 may be connected in parallel. Therefore, the number of the first driving units 246 for driving the first display area 240 is reduced. Accordingly, the first driving units 246 may be disposed in the black border, which can improve the light transmittance of the first display area 240 without affecting the second display area 220 or the third display area 260. Multiple first driving units 246 need to be disposed corresponding to the first pixels 242 in the first display area 240, and all the first driving units 246 may be disposed in the black border.

In order to make the black border better accommodate all the first driving units 246, simpler first drive units 246 may be used.

For example, the first driving units 246 may adopt 2T1C, 5T1C, or other driving circuit, so that a number of thin film transistors in each of the first driving units 246 is small, and one first driving unit 246 requires less space. An arrangement density of the first pixels 242 in the first display area 240 may be set smaller, so that a total number of the first driving units 246 configured to drive the first display area 240 is smaller. It should be noted that some of the first driving units 246 may be disposed in the non-display area 280 and the other first driving units 246 may be disposed in other position, such as the first display area 240 or the third display area 260.

It should be noted that, in this embodiment, a method of improving the light transmittance of the first display area 240 is not limited to the above method, and other methods may be used.

For example, wires in the first display area 240 of the display device 20 may be set to be transparent, so as to increase the light transmittance of the first display area 24. For another example, the first display area 240 may not be provided with a polarizing structure. For still another example, the first driving units 246 for driving the first display area 240 may be driven by passive driving, which greatly reduce the wires in the first display area 240 and components in the first driving units 246. It can be understood that solutions of improving the light transmittance of the first display area 240 by increasing a light transmittance of a material and changing an arrangement of wires fall within the claimed scope of the present application.

In this embodiment, the second display area 220 may be an active-driving (i.e. active-matrix organic light-emitting diode, AMOLED) display area, and the first display area 240 may be an active-driving display area or a passive-driving (i.e. passive-matrix organic light-emitting diode, PMOLED) display area. In this embodiment, the area of the first display area 240 may be set to be less than the area of the second display area 220, so that a display content of the first display area 240 is less than a display content of the second display area 220, and an importance of the display content of the first display area 240 is lower than an importance of the display content of the second display area 220. Therefore, in this embodiment, using AMOLED in the second display area 220 can ensure that the main display area of the display device 20 have a better display effect. Furthermore, the first display area 240 adopts PMOLED. The passive-driving first display area 240 can be driven by only one thin film transistor, so that a number of opaque thin film transistors is small, which greatly improve the light transmittance of the first display area 240. Moreover, the area of the first display area 240 may be much less than the area of the second display area 220. If a quality of images displayed in the first display area 240 is reduced, an entire display of the display device 20 will not be greatly affected. It should be noted that the first display area 240 may be active-driving, so that a display effect of the first display area 240 is close to a display effect of the second display area 220.

In this embodiment, the third display area 260 may be configured as an active-driving display area or a passive-driving display area as required. Because a physical structure of each of the third pixels 262 in the third display area 260 is same as and the physical structure of each of the first pixels 242 in the first display area 240, the third display area 260 and the first display area 240 may be driven in a same manner.

For example, the third display area 260 and the first display area 240 may be passive-driving display areas. If the area of the third display area 260 is larger, or in order to improve a display quality of the third display area 260, the third display area 260 and the second display area 220 may be driven in a same manner, for example, may be active-driving display areas.

A size and shape of the first pixels 242 in the first display area 240 may be set as required.

For example, each of the first pixels 242 may be shaped as a rectangle or a circle-like shape. Each of the circle-like first pixel 242 may be shaped as a circle, an ellipse, a rounded rectangle, or the like. The circle-like first pixels 242 can improve a diffraction problem of the first display area 240 because their edges are arc-shaped.

In this embodiment, the functional component of the electronic device 10, such as the camera 60 or the sensor, may be disposed inside the display device 20.

For example, a lens of the camera 60 faces the lower substrate 270 of the display device 20, and the camera 60 is disposed corresponding to the first display area 240. In other words, the camera 60 is located below the lower substrate 270 in the first display area 240. The camera 60 can acquire external light signals passing through the first display area 240 for imaging. In this embodiment, the lens of the camera 60 and the lower substrate 270 may be spaced apart. Alternatively, the lens of the camera 60 may be a part of the lower substrate 270.

For example, a part of the lower substrate 270 corresponding to the first display area 240 is formed into an arc-shaped structure.

In order to reduce a space of the electronic device 10 occupied by the camera 60, the lens of the camera 60 may be disposed close to or adjacent to the lower substrate 270 of the display device 20. The lower substrate 270 of the display device 20 is mainly configured to carry other layers of the display device 20 and does not need to have any special function.

Figure 15:
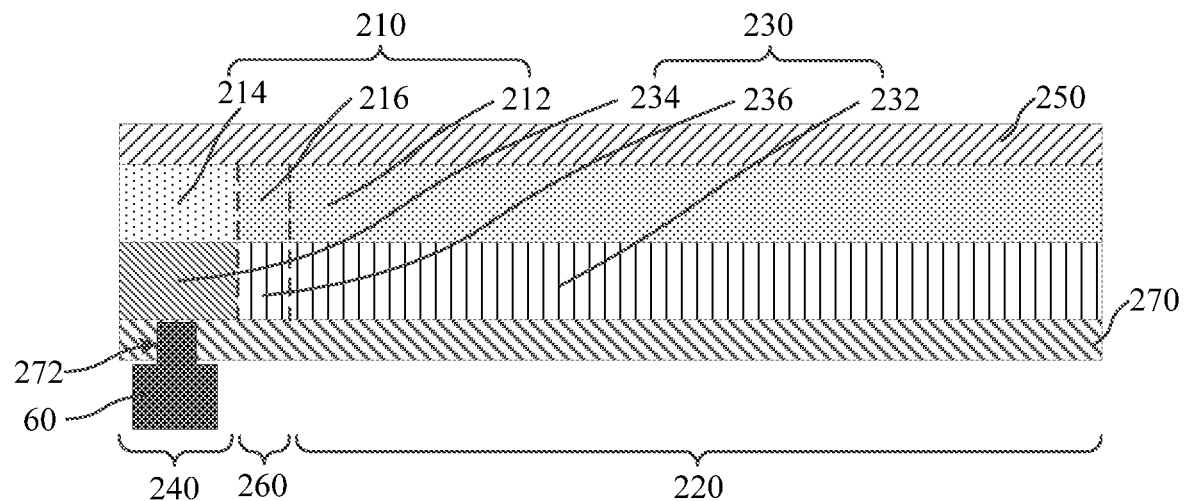
FIG. 15 is a first schematic structural diagram of a cooperation of the display device in the electronic device and a camera according to an embodiment of the present disclosure.

Please refer to FIG. 15. FIG. 15 is a first schematic structural diagram of a cooperation of the display device in the electronic device and a camera according to an embodiment of the present disclosure. In order to further reduce a space inside the electronic device 10 occupied by the camera 60, a part of the lower substrate 270 corresponding to the camera 60 may be provided with a first mounting hole 272. The camera 60 may be disposed at least partially in the first mounting hole 272. The first mounting hole 272 may be a blind hole. That is, a thickness of the part of the lower substrate 270 corresponding to the camera 60 is less than a thickness of other parts of the lower substrate 270. The lower substrate 270 is still a complete substrate, its function of carrying other layers of the display device 20 is not affected, and a part of its space is vacated to accommodate the camera 60. The first mounting hole 272 and the camera 60 may be installed according to a size of the first mounting hole 272 and a size of the camera 60.

For example, if a space of the first mounting hole 272 is not enough to install an entirety of the camera 60, the lens of the camera 60 may be disposed in the first mounting hole 272. If the camera 60 is small enough, the entirety of the camera 60 may be disposed in the first mounting hole 272.

It should be noted that the camera 60 may be replaced with another functional device of the electronic device 10, such as a sensor. That is, at least a part of the sensor of the electronic device 10 may be disposed in the first mounting hole 272.

Figure 16:
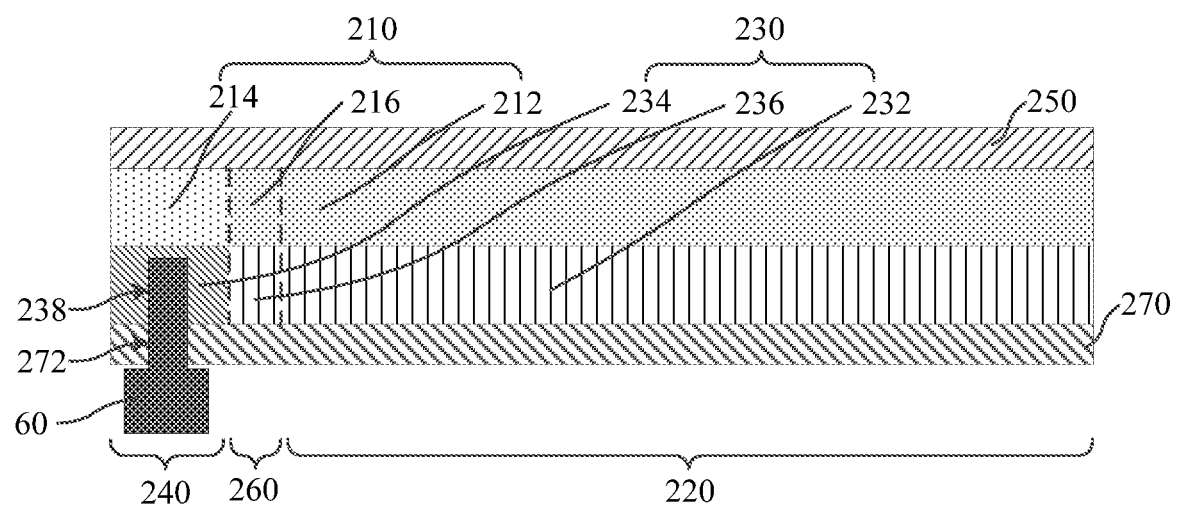
FIG. 16 is a second schematic structural diagram of the cooperation of the display device in the electronic device and the camera according to an embodiment of the present disclosure.

Please refer to FIG. 16. FIG. 16 is a second schematic structural diagram of the cooperation of the display device in the electronic device and the camera according to an embodiment of the present disclosure. Because the part of the driving layer 230 in the first display area 240 may not be provided with the first driving units, the camera 60 may be installed in the driving layer 230. Specifically, the first mounting hole 272 opened in the lower substrate 270 is a through hole. The part of the driving layer 230 in the first display area 240 is provided with a second mounting hole 238 corresponding to the camera 60. The first mounting hole 272 communicates with the second mounting hole 238. The camera 60 may be disposed at least partially in the second mounting hole 238.

For example, the lens of the camera 60 is disposed in the first mounting hole 272 and the second mounting hole 238. The second mounting hole 238 may be a through hole or a blind hole. The first mounting hole 272 and the second mounting hole 238 may be formed after some layers of the display device 20 are formed.

For example, after the driving layer 230 and the display layer 210 of the display device 20 are disposed on the lower substrate 270, the first mounting hole 272 and the second mounting hole 238 are formed in the parts of the driving layer 230 and the display layer 210 corresponding to the lens of the camera 60 using a laser or the like.

It should be noted that the camera 60 may be replaced with another functional device of the electronic device 10, such as a sensor. That is, at least a part of the sensor of the electronic device 10 may be disposed in the first mounting hole 272 and the second mounting hole 238.

It can be understood that the camera 60 corresponding to the first display area 240 may be used as a front camera of the electronic device 10. A current front camera is generally a camera with a lens that cannot be moved. Because the lower substrate 270 and the driving layer 230 of the display device 20 may be respectively provided with the first mounting hole 272 and the second mounting hole 238, the camera 60 corresponding to the first display area 240 may be a camera with a movable lens. The lens of the camera 60 can be moved to realize functions such as auto focus. It should be noted that the camera 60 may be a rear camera. That is, the electronic device 10 may be provided with two opposite display devices 20.

The first display area 240 may be provided with one camera 60 or multiple cameras 60. The multiple cameras 60 may be cameras that cooperate with each other, such as two identical cameras, a normal camera, and a bokeh camera or a black-and-white camera.

In addition to the camera 60, the first display area 240 may be further provided with other functional devices, such as a proximity sensor, a light sensor, a ranging sensor, a fingerprint recognition sensor, and the like.

In this embodiment, multiple driving layers may also be used to improve the light transmittance of the first display area 240.

For example, a display device is provided with two driving layers. A plurality of first driving units for driving a first display area are disposed in one of the driving layers and away from the first display area. And, a plurality of second driving units for driving a second display area is disposed in the other driving layer and away from the first display area. Therefore, the first and second driving units are disposed away from the first display area, which greatly improves a light transmittance of the first display area. A solution for improving the light transmittance of the first display area by using two driving layers will be described in detail below with reference to the accompanying drawings.

Figure 17:
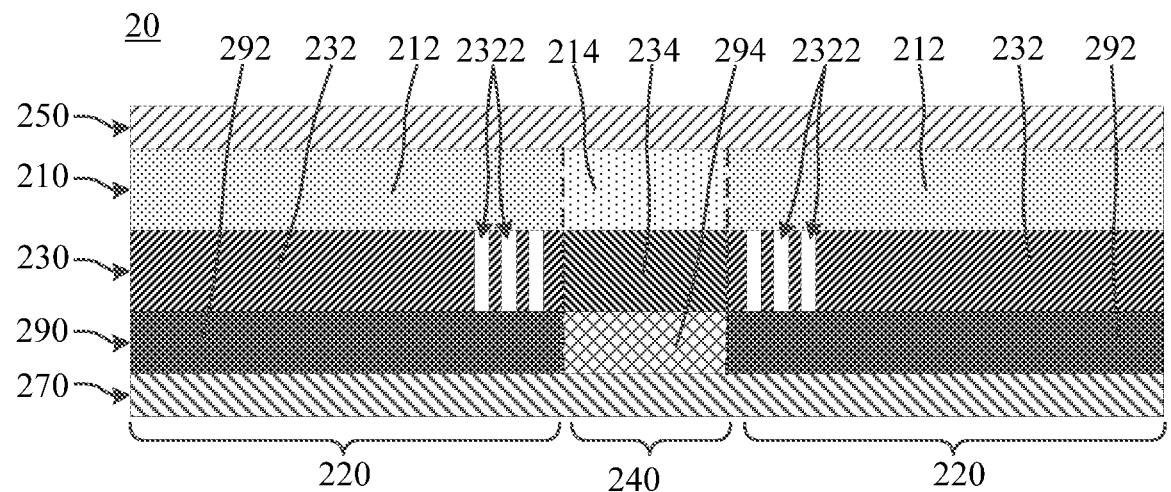
FIG. 17 is a cross-sectional view of the display device shown in FIG. 2 along a line P4-P4.

Please refer to FIG. 17. FIG. 17 is a cross-sectional view of the display device shown in FIG. 2 along a line P4-P4. The display device 20 may include an upper substrate 250, a display layer 210, a second driving layer 230, a first driving layer 290, and a lower substrate 270 which are stacked in sequence. In the display device 20, the first driving layer 290 and the second driving layer 230 can drive the display layer 210 to display images. The display layer 210 shown in FIG. 17 may refer to the display layer 210 shown in FIG. 3, the upper substrate 250 shown in FIG. 17 may refer to the upper substrate 250 shown in FIG. 3, and the lower substrate 270 shown in FIG. 17 may refer to the lower substrate 270 shown in FIG. 3, which will not be described in detail herein.

The second driving layer 230 shown in FIG. 17 may include a second light-transmitting portion 234 and a second driving portion 232. The second driving portion 232 may be provided with a plurality of second driving units. The second driving units disposed in the second driving portion 232 can drive a plurality of second pixels in the second display area 220. The second driving portion 232 may be disposed in the second display area 220. In other words, the second driving portion 232 may be disposed corresponding to the second display portion 212.

For example, the second driving portion 232 and a second display portion 212 are stacked. It should be noted that the second light-transmitting portion 234 and the second driving portion 232 are used to define positions of portions of the second driving layer 230. The second driving layer 230 may be provided not only with driving units, but also with wires.

At least a part of the second light-transmitting portion 234 may be disposed in the first display area 240.

For example, the second light-transmitting portion 234 is disposed in the first display area 240. In other words, the second light-transmitting portion 234 may be disposed corresponding to a first display portion 214.

For example, the second light-transmitting portion 234 and the first display portion 214 are stacked. The second light-transmitting portion 234 may not be provided with driving units, so as to increase a light transmittance of the second light-transmitting portion 234, thereby increasing the light transmittance of the first display area 240.

In some embodiments, a size of the second light-transmitting portion 234 is same as a size of the first display portion 214. The second light-transmitting portion 234 overlaps the first display portion 214 in a direction perpendicular to the display device 20. In other words, a projection of the second light-transmitting portion 234 on the display layer 210 overlaps with the first display portion 214. The size of the first display portion 214 may be slightly smaller than the size of the second light-transmitting part 234.

For example, a projection of the first display portion 214 on the lower substrate 270 is located inside a projection of the second light-transmitting portion 234 on the lower substrate 270. In this embodiment, the size of the first display portion 214 is set to be smaller than or equal to the size of the second light-transmitting portion 234 to ensure that a part of the second driving layer 230 corresponding to the first display portion 214 has no driving unit, thereby improving the light transmittance of the first display area 240.

It should be noted that a part of the second light-transmitting portion 234 may be disposed corresponding to the second display portion 212, as long as it is ensured that the part of the second driving layer 230 corresponding to the first display portion 214 has no driving unit.

Please refer to FIG. 17, the second driving layer 230 is provided with a plurality of via holes 2322, and the via holes 2322 penetrate the second driving layer 230 in a thickness direction of the second driving layer 230. One or more signal lines may be disposed in each of the via holes 2322. The via holes 2322 may be provided in the second driving portion 232 but not provided in the second transparent portion 234, which can ensure that the second light-transmitting portion 234 has no driving circuit, so that a number of wires in the second light-transmitting portion 234 are reduced, or no wires are disposed in the second light-transmitting portion 234.

The first driving layer 290 shown in FIG. 17 may include a first driving portion 292 and a first light-transmitting portion 294. The first driving portion 292 may be provided with a plurality of first driving units. The first driving units disposed in the first driving portion 292 can drive the first pixels in the first display area 240. The first driving portion 292 may be disposed in the second display area 220. In other words, the first driving portion 292 may be disposed corresponding to the second display portion 212.

For example, the first driving portion 292, the second driving portion 232, and the second display portion 212 are stacked in sequence. It should be noted that the first driving portion 292 and the first light-transmitting portion 294 are used to define positions of portions of the first driving layer 290. The first driving portion 292 may be provided not only with driving units, but also with wires.

At least a part of the first light-transmitting portion 294 may be disposed in the first display area 240.

For example, the first light-transmitting portion 294 is disposed in the first display area 240. In other words, the first light-transmitting portion 294 may be disposed corresponding to a first display portion 214.

For example, the first light-transmitting portion 294, the second light-transmitting portion 234, and the first display portion 214 are stacked in sequence. The first light-transmitting portion 294 may not be provided with driving units, so as to increase a light transmittance of the first light-transmitting portion 294, thereby increasing the light transmittance of the first display area 240.

In some embodiments, a size of the first light-transmitting portion 294 is same as a size of the first display portion 214. The first light-transmitting portion 294 overlaps the first display portion 214 in a direction perpendicular to the display device 20. In other words, a projection of the first light-transmitting portion 294 on the display layer 210 overlaps with the first display portion 214. The size of the first display portion 214 may be slightly smaller than the size of the second light-transmitting part 234.

For example, a projection of the first display portion 214 on the lower substrate 270 is located inside a projection of the first light-transmitting portion 294 on the lower substrate 270. In this embodiment, the size of the first display portion 214 is set to be smaller than or equal to the size of the first light-transmitting portion 294 to ensure that a part of the second driving layer 230 corresponding to the first display portion 214 has no driving unit, thereby improving the light transmittance of the first display area 240.

It should be noted that a part of the first light-transmitting portion 294 may be disposed corresponding to the second display portion 212, as long as it is ensured that the part of the first driving layer 290 corresponding to the first display portion 214 has no driving unit.

It should be noted that, in this embodiment, the second light-transmitting portion 234 is located between the first light-transmitting portion 294 and the first display portion 214. The first light-transmitting portion 294, the second light-transmitting portion 234, and the first display portion 214 may have a same size and overlap with each other, but a size relationship of the first light-transmitting portion 294, the second light-transmitting portion 234, and the first display portion 214 is not limited thereto.

For example, sizes of the first light-transmitting portion 294, the second light-transmitting portion 234, and the first display portion 214 may be sequentially reduced. For another example, the size of the first light-transmitting portion 294 is smaller than the sizes of the second light-transmitting portion 234 and the first display portion 214, and the size of the second light-transmitting portion 234 is same as the size of the first display portion 214. For yet another example, the size of the first light-transmitting portion 294 is same as the size of the second light-transmitting portion 234, and the sizes of the first light-transmitting portion 294 and the second light-transmitting portion 234 are smaller than the size of the first display portion 214.

In this embodiment, the signal lines may be inserted into the via holes 2322. The signal lines may electrically connect the first pixels in the first display area 240 with the first driving units in the first driving layer 290.

For example, the signal lines may electrically connect the first pixels in the first display portion 214 with the first driving units in the first driving portion 292, so that the first driving units in the first driving portion 292 can drive the first pixels. For the first pixels, please refer to the aforementioned first pixels 242, and for the first driving units, please refer to the aforementioned first driving units 246, which will not be described in detail herein.

One end of each of the signal lines may be electrically connected to one first pixel in the first display area 240. The signal lines electrically connected to the first pixels may be disposed in the second display area 220 and pass through the via holes 2322 in the second display area 220. The other end of each of the signal lines may be electrically connected to one first driving unit in the second display area 240.

For example, one end of each of the signal lines is electrically connected to one first pixel in the first display portion 214. The signal lines may be disposed from the second light-transmitting portion 234 to the second driving portion 232, pass through the via holes 2322 in the second driving portion 232 to the first driving portion 292, and be electrically connected with the first driving units in the first driving part 292. Therefore, the first driving units are not disposed in the first display area 214, but drive the first pixels in the first display area 214. It should be noted that in an actual wiring process, the first pixels may be arranged more sparsely than the second pixels, or the size of the first pixels may be set to be greater than the size of the second pixels, or multiple first pixels may be connected in parallel, so that a number of the signal lines is greatly reduced, and the signal lines can be disposed in the second light-transmitting portion 234 and pass through the via holes 2322.

Accordingly, in this embodiment, the display device 20 shown in FIG. 17 is provided with two driving layers, and the driving units are disposed in the second display area 220 instead of the first display area 240, which improves the light transmittance of the first display area 240.

The via holes 2322 may be arranged in the second driving portion 232 and may be arranged around the second light-transmitting portion 234.

For example, the via holes 2322 are arranged around the second light-transmitting portion 234 at equal intervals. Compared with arranging the via holes 2322 at a certain position, in this embodiment, the via holes 2322 are arranged around the second light-transmitting portion 234 to disperse the via holes 2322, which not only facilitates an arrangement of signal lines, but also reduces lengths of the signal lines. It should be noted that an internal space of the display device 20 is limited. When the via holes 2322 are arranged at a same position, more space of the second driving layer 230 is occupied, thereby affecting an arrangement of wires in the second driving layer 230. In this embodiment, the via holes 2322 are arranged at intervals to reduce an influence of the via holes 2322 on the arrangement of the wires in the second driving layer 230, which is easier to implement.

It can be understood that if the via holes 2322 are arranged in the second driving portion 232, the second driving portion 232 will be provided with multiple second driving units. The second driving units will occupy a space of the second driving portion 232. However, a free space in the second driving portion 232 is limited. Therefore, in this embodiment, the via holes 2322 may be disposed between the second driving units.

For example, one, two, or three via holes 2322 are arranged between four second driving units. It should be noted that, the via holes 2322 may be arranged between thin film transistors of the second driving units.

In order to further improve the light transmittance of the first display area 240, the size of the first pixels in the first display area 240 may be set to be greater than the size of the second pixels in the second display area 220.

For example, the size of the first pixels is four times, sixteen times, etc., the size of the second pixels. This can reduce the number of the first pixels in the first display portion 214, and can reduce the number of the wires and the number of the first driving units in the first display portion 214. Therefore, it is easier to connect the first pixels in the first display portion 214 to the signal lines, and to connect the signal lines to the first driving units through the via holes 2322. Furthermore, the number of the wires in the first display portion 214 may be reduced to further improve the light transmittance of the first display area 240.

It should be noted that the arrangement and size of the first pixels in the first display area 214 and the arrangement and size of the second pixels in the second display area 212 may be same. That is, the first display area 214 and the second display area 212 may have a same pixel physical structure. If the first display area 214 and the second display area 212 have the same pixel physical structure, the first pixels in the first display area 214 and the second pixels in the second display area 212 may refer to FIG. 4 to FIG. 9 and their corresponding contents for details, which will not be described in detail herein.

For example, sixteen first pixels in the first display area 214 are connected in parallel to form one first pixel group, one first pixel group may be electrically connected to one first driving unit, and the sixteen first pixels in one first pixel group may have a same color. Three first pixel groups may form one display unit in the first display area 214, wherein the first pixels in one first pixel group may be red pixels, the first pixels in another first pixel group may be green pixels, and the first pixels in the other first pixel group may be blue pixels. Therefore, the number of the first driving units is reduced, the number of the via holes 2322 is reduced, and the number of the wires in the first display area 240 or the first display portion 214 is reduced. It is easier to connect the first pixels in the first display portion 214 to the signal lines, and to connect the signal lines to the first driving units through the via holes 2322. Furthermore, the wires in the first display portion 214 may be reduced to further improve the light transmittance of the first display area 240.

Accordingly, in this embodiment, if the display device 20 is combined with a functional device such as the camera 60 or a sensor, the functional device such as the camera 60 or the sensor can more easily transmit optical signals through the first display area 240 of the display device 20.

It can be understood that because the first light-transmitting portion 294 and the second light-transmitting portion 234 are not provided with the driving units, the functional device of the electronic device 10 may be disposed in the first light-transmitting portion 294 and the second light-transmitting portion 234.

Figure 18:
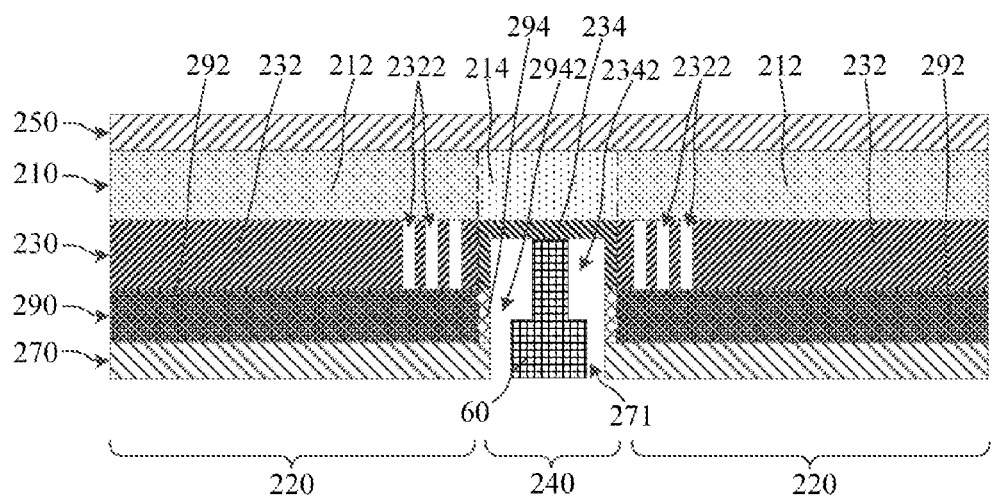
FIG. 18 is a third schematic structural diagram of the cooperation of the display device in the electronic device and the camera according to an embodiment of the present disclosure.

Please refer to FIG. 18. FIG. 18 is a third schematic structural diagram of the cooperation of the display device in the electronic device and the camera according to an embodiment of the present disclosure. In this embodiment, a hole 271 may be provided in the lower substrate 270, a hole 2942 may be provided in the first light-transmitting portion 294, and a hole 2342 may be provided in the second light-transmitting portion 234. The hole 271 of the lower substrate 270, the hole 2942 of the first light-transmitting portion 294, and the hole 2342 of the second light-transmitting portion 234 may communicate with each other. In this embodiment, a part or all of a functional device such as the camera 60 or a sensor may be installed in the hole 2942, the hole 2342, and the hole 271.

It can be understood that the hole 2942 of the first light-transmitting portion 294 may be referred to as a first hole 2942, and its size may be set according to a requirement of the functional device such as the camera 60.

For example, the first hole 2942 is slightly smaller than the first light-transmitting portion 294. The hole 2342 of the second light-transmitting portion 294 may be referred to as a second hole 2342, and its size may be set according to the requirement of the functional device such as the camera 60.

For example, the second hole 2342 is slightly smaller than the second light-transmitting portion 234. The hole 271 of the lower substrate 270 may be referred to as a third hole 271.

It should be noted that when the functional device such as the camera 60 are installed, the camera 60 is generally composed of a lens and a base. A volume of the lens is generally smaller than a volume of the base.

For example, a cross section of the lens is smaller than a cross section of the base. Therefore, a space required for accommodating the lens of the camera 60 is smaller than a space required for accommodating the base of the camera 60. Therefore, in this embodiment, an area of the first hole 2942 parallel to the display surface of the display device 20 may be set to be greater than an area of the second hole 2342 parallel to the display surface of the display device 20, and an area of the third hole 271 parallel to the display surface of the display device 20 may be set to be greater than the area of the first hole 2942 parallel to the display surface of the display device 20. It can be understood that in this embodiment, the area of the second hole 2342 parallel to the display surface of the display device 20 may be set to be greater than an area of the first display portion 214 parallel to the display surface of the display device 20. In other words, a projection of the third hole 271 on the display layer 210 covers a projection of the first hole 2942 on the display layer 210, and the projection of the first hole 2942 on the display layer 210 covers a projection of the second hole 2342 on the display layer 210.

It should be noted that the projection of the second hole 2342 on the display layer 210 covers the first display area 240. The first display area 240 is spatially located within the second hole 2342, so as to facilitate the functional device such as the camera 60 to transmit signals.

For example, the first hole 2942, the second hole 2342, and the third hole 271 are all circular holes. A diameter of the third hole 271 may be greater than a diameter of the first hole 2942. The diameter of the first hole 2942 may be greater than a diameter of the second hole 2342.

It can be understood that in this embodiment, the first hole 2942, the second hole 2342, and the third hole 271 may be set to be substantially same.

For example, the diameters of the first hole 2942, the second hole 2342, and the third hole 271 are same. In this embodiment, the area of the second hole 2342 parallel to the display surface of the display device 20 may be set to be equal to the area of the first display portion 214 parallel to the display surface of the display device 20.

Figure 19:
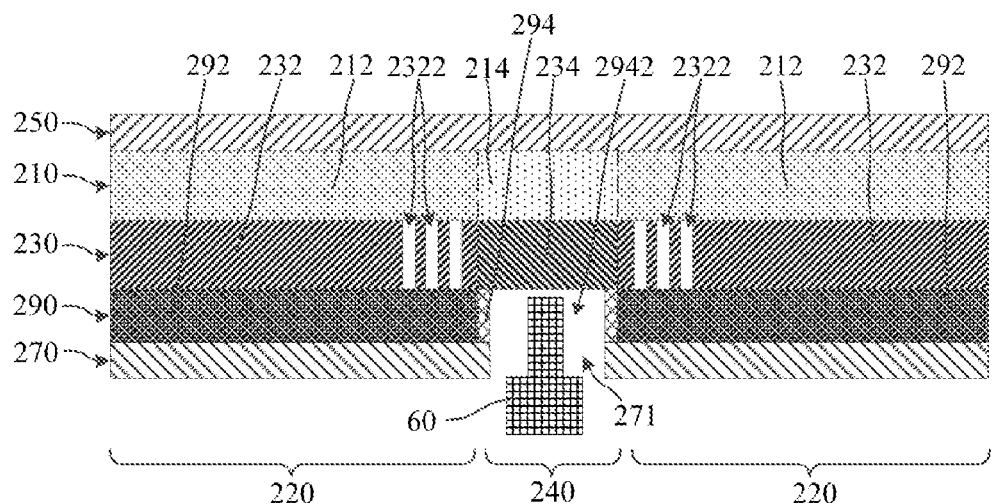
FIG. 19 is a fourth schematic structural diagram of the cooperation of the display device in the electronic device and the camera according to an embodiment of the present disclosure.

Please refer to FIG. 19. FIG. 19 is a fourth schematic structural diagram of the cooperation of the display device in the electronic device and the camera according to an embodiment of the present disclosure. In this embodiment, a third hole 271 may be provided in the lower substrate 270, and a first hole 2942 may be provided in the first light-transmitting portion 294. The first hole 2942 and the third hole 271 communicate with each other. The first hole 2942 may refer to the first hole 2942 shown in FIG. 18. It should be noted that when the first hole 2942 is a blind hole, an opening of the first hole 2942 is away from the second driving layer 230 to ensure that the first hole 2942 and the third hole 271 communicate with each other. In this embodiment, a part or all of a functional device such as the camera 60 or a sensor may be installed in the hole 2942 and the hole 272.

Figure 20:
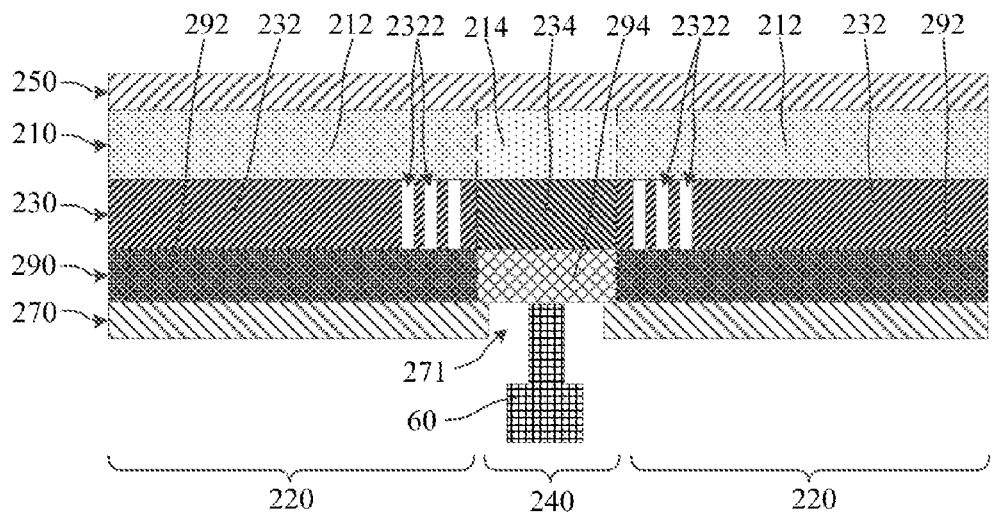
FIG. 20 is a fifth schematic structural diagram of the cooperation of the display device in the electronic device and the camera according to an embodiment of the present disclosure.

In this embodiment, it is also possible to provide only the third hole 271 in the lower substrate 270. Please refer to FIG. 20, which is a fifth schematic structural diagram of the cooperation of the display device in the electronic device and the camera according to an embodiment of the present disclosure. The third hole 270 provided in the lower substrate 270 may correspond to the first light-transmitting portion 294 and the second light-transmitting portion 234. A part or all of a functional device such as the camera 60 or a sensor may be installed in the hole 272.

Please refer to FIG. 1, the electronic device 10 may further include a housing 40. The housing 40 may be made of plastic, glass, ceramic, a fiber composite, a metal (e.g. stainless steel and aluminum), other suitable material, or a combination of any two or more of these materials. The housing 40 may be integrally formed. In an integrally formed process, some or all of the housing 40 is machined or molded as a single structure, or may be formed from multiple structures (e.g., an inner frame structure, and one or more structures forming an outer housing surface). The housing 40 may be provided with a receiving cavity to receive components of the electronic device 10 such as a battery, a circuit board, and the like. The housing 40 may carry the display device 20.

The display device and the electronic device provided by the present disclosure are described in detail above. The present disclosure uses specific examples to describe principles and embodiments of the present disclosure.

The above description of the embodiments is only for helping to understand the present disclosure. Furthermore, those skilled in the art may make modifications to the specific embodiments and applications according to ideas of the present disclosure. In conclusion, the present specification should not be construed as a limitation to the present disclosure.

What is claimed is:

1. A display device, comprising a first display area and a second display area, and further comprising:
    a display layer comprising a plurality of first pixels disposed in the first display area and a plurality of second pixels disposed in the second display area, wherein the first pixels form a plurality of first pixel groups, and the first pixels in each of the first pixel groups are connected in parallel;
    a first driving layer comprising a plurality of first driving units disposed in the second display area, wherein the first driving units are configured to drive the first pixels; and
    a second driving layer comprising a plurality of second driving units disposed in the second display area and provided with a plurality of via holes penetrating the second driving layer in a thickness direction of the second driving layer, wherein the second driving units are configured to drive the second pixels, and at least some of the via holes are located in the second display area and are configured for a plurality of signal lines to pass through to electrically connect the first driving units and the first pixels;
    wherein the display layer, the second driving layer, and the first driving layer are stacked in sequence, and each of the first driving units is electrically connected to one first pixel group through one signal line and is configured to drive all the first pixels in the first pixel group.

2. The display device according to claim 1, further comprising a plurality of display units disposed in the first display area, each of the display units disposed in the first display area comprises at least three of the first pixel groups, in each of the display units, the first pixels in each of the first pixel groups have a same color, and the first pixels in different first pixel groups have different colors.

3. The display device according to claim 2, wherein the first display area has a same pixel physical structure as the second display area, each of the first pixel groups comprises only sixteen first pixels of a same color.

4. The display device according to claim 2, wherein a size of each of the first pixels is four times a size of each of the second pixels, each of the first pixel groups comprises only four first pixels of a same color.

5. The display device according to claim 1, wherein a size of each of the first pixels is greater than a size of each of the second pixels.

6. The display device according to claim 1, wherein the via holes are all located in the second display area.

7. The display device according to claim 6, wherein the via holes are all arranged at intervals between the second driving units.

8. The display device according to claim 6, wherein the via holes are arranged around the first display area.

9. The display device according to claim 1, wherein the first driving layer is provided with a first hole, the first hole is located in the first display area, and an opening of the first hole is located away from the second driving layer.

10. The display device according to claim 1, wherein the first driving layer is provided with a first hole, the second driving layer is provided with a second hole, the first hole and the second hole are both located in the first display area and communicate with each other.

11. The display device according to claim 10 wherein a projection of the first hole on the display layer covers a projection of the second hole on the display layer, and the projection of the second hole on the display layer covers the first display area.

12. An electronic device, comprising:
    a display device comprising a first display area and a second display area and further comprising:
        a display layer comprising a plurality of first pixels disposed in the first display area, wherein the first pixels form a plurality of first pixel groups, and the first pixels in each of the first pixel groups are connected in parallel;
        a first driving layer disposed below the display layer and comprising a plurality of first driving units disposed in the second display area, wherein the first driving units are configured to drive the first pixels; and
        a second driving layer disposed between the display layer and the first driving layer and provided with a plurality of via holes penetrating a portion of the second driving layer in the second display area, wherein the via holes are configured for a plurality of signal lines to pass through to electrically connect the first driving units and the first pixels; and
    a functional device configured to transmit a light signal through the first display area,
        wherein each of the first driving units is electrically connected to one first pixel group through one signal line and is configured to drive all the first pixels in the first pixel group.

13. The electronic device according to claim 12, wherein the first pixels in each of first pixel groups have a same color, the display device further comprises a plurality of display units disposed in the first display area, each of the display units disposed in the first display area comprises at least three of the first pixel groups, and in each of the display units, the first pixels in different first pixel groups have different colors.

14. The electronic device according to claim 13, wherein the first display area has a same pixel physical structure as the second display area, each of the first pixel groups comprises only sixteen first pixels of a same color.

15. The electronic device according to claim 13, wherein the display layer further comprises a plurality of second pixels disposed in the second display area, and a size of each of the first pixels is four times a size of each of the second pixels, each of the first pixel groups comprises only four first pixels of a same color.

16. The electronic device according to claim 13, wherein the display layer further comprises a plurality of second pixels disposed in the second display area, and a size of each of the first pixels is greater than a size of each of the second pixels, the second driving layer further comprises a plurality of second driving units disposed in the second display area, the second driving units are configured to drive the second pixels, and the via holes are all arranged at intervals between the second driving units.

17. The electronic device according to claim 12, wherein the display device further comprises a first substrate, the first substrate is provided with a hole, and the functional device is at least partially disposed in the hole.

18. The electronic device according to claim 17, wherein the first driving layer is provided with a first hole, the first hole is located in the first display area, an opening of the first hole is located away from the second driving layer, the hole communicates with the opening of the first hole, and the functional device is at least partially disposed in the first hole and the hole.

19. The electronic device according to claim 17, wherein the first driving layer is provided with a first hole, the second driving layer is provided with a second hole, the first hole and the second hole are both located in the first display area and communicate with each other, the hole communicates with the first hole and the second hole, and the functional device is at least partially disposed in the first hole, the second hole, and the hole.

\* \* \* \* \*